(12) United States Patent
Shin et al.

(10) Patent No.: US 11,800,652 B2
(45) Date of Patent: Oct. 24, 2023

(54) DISPLAY DEVICE AND ELECTRONIC DEVICE INCLUDING THE SAME

(71) Applicant: Samsung Display Co., Ltd., Yongin-si (KR)

(72) Inventors: Jaiku Shin, Hwaseong-si (KR); Dongjin Park, Seongnam-si (KR); Dongwoo Seo, Suwon-si (KR); Sung Chul Choi, Hwaseong-si (KR); Sojeong La, Suwon-si (KR); Jihye Shin, Cheonan-si (KR); Seokchan Lee, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 83 days.

(21) Appl. No.: 17/242,834

(22) Filed: Apr. 28, 2021

(65) Prior Publication Data
US 2022/0061168 A1   Feb. 24, 2022

(30) Foreign Application Priority Data

Aug. 19, 2020   (KR) .................. 10-2020-0104062

(51) Int. Cl.
*B32B 7/02*   (2019.01)
*H05K 5/00*   (2006.01)
*H05K 5/02*   (2006.01)
*B32B 3/08*   (2006.01)
*B32B 3/26*   (2006.01)
(Continued)

(52) U.S. Cl.
CPC ........... *H05K 5/0017* (2013.01); *B32B 3/085* (2013.01); *B32B 3/266* (2013.01); *B32B 7/02* (2013.01); *B32B 7/14* (2013.01); *H05K 5/0217* (2013.01); *H10K 50/84* (2023.02); *B32B 2307/51* (2013.01); *B32B 2457/20* (2013.01)

(58) Field of Classification Search
CPC . B32B 2307/51; B32B 2457/20; B32B 3/085; B32B 3/266; B32B 7/02; B32B 7/14; G06F 1/1652; H05K 5/0017; H05K 5/0217; H10K 2102/311; H10K 50/84; H10K 77/111; Y02E 10/549
See application file for complete search history.

(56) References Cited

U.S. PATENT DOCUMENTS 10,586,941 B2   3/2020   Lee et al.
2019/0205596 A1   7/2019   Kim et al.
2019/0334114 A1   10/2019   Park
(Continued)

FOREIGN PATENT DOCUMENTS

EP   3680749 A2   7/2020
KR   1020170084402 A   7/2017
KR   1020190124844 A   11/2019

*Primary Examiner* — Lawrence D Ferguson
(74) *Attorney, Agent, or Firm* — CANTOR COLBURN LLP

(57) ABSTRACT

A display device including a display panel including a folding area and a non-folding area adjacent along a first direction, a support layer facing the display panel with a barrier layer therebetween, openings defined in the support layer and corresponding to the folding area, a cushion layer facing the display panel with the support layer therebetween, and a barrier adhesive layer between the barrier layer and the support layer, the barrier adhesive layer including a first barrier portion and a second barrier portion spaced apart from each other along the first direction with the plurality of openings of the support layer therebetween.

24 Claims, 13 Drawing Sheets

(51) Int. Cl.
    *B32B 7/14* (2006.01)
    *H10K 50/84* (2023.01)

(56) References Cited

U.S. PATENT DOCUMENTS

2020/0137900 A1    4/2020    Park et al.
2020/0260596 A1    8/2020    Park et al.

DISPLAY DEVICE AND ELECTRONIC DEVICE INCLUDING THE SAME

This application claims priority to Korean Patent Application No. 10-2020-0104062, filed on Aug. 19, 2020, and all the benefits accruing therefrom under 35 U.S.C. 5 § 119, the entire contents of which are hereby incorporated by reference.

BACKGROUND

(1) Field

The disclosure herein relates to a display device and an electronic device including the same, and more particularly, to a foldable display device and an electronic device including the same.

(2) Description of the Related Art

An electronic device displays various images on a display screen and provides information to outside of the electronic device. In general, the electronic device displays information within an assigned screen. Flexible electronic devices including a foldable flexible display panel have been developed. The flexible electronic device may be foldable, rollable and/or bendable unlike a rigid electronic device. The flexible electronic device that is variously changeable in shape may be transported regardless of the size of the assigned screen to improve convenience of using the flexible electronic device.

SUMMARY

One or more embodiment provides a display device having improved product reliability and an electronic device including the same.

An embodiment provides a display device including a display panel including a folding area and a non-folding area adjacent to the folding area along a first direction, a support layer facing the display panel with a barrier layer therebetween, openings defined in the support layer and corresponding to the folding area, a cushion layer facing the display panel with the support layer therebetween, and a barrier adhesive layer between the barrier layer and the support layer, the barrier adhesive layer including a first barrier portion and a second barrier portion spaced apart from each other along the first direction with the plurality of openings of the support layer therebetween.

In an embodiment, the support layer may face both the folding area and the non-folding area. Along the first direction, each of the cushion layer, the support layer and the barrier layer may have a width, the width of the cushion layer may be less than the width of the support layer, and the width of the barrier layer may be less than the width of the support layer.

In an embodiment, the cushion layer may include a first cushion layer and a second cushion layer spaced apart from the first cushion layer by a gap, and the gap between the first cushion layer and the second cushion layer may correspond to the foldable area of the display panel.

In an embodiment, the support layer may have an elastic modulus greater than that of the cushion layer.

In an embodiment, the barrier adhesive layer may have a thickness less than that of the barrier layer.

In an embodiment, the barrier layer may include a colored polyimide film.

In an embodiment, the barrier layer may include a light shielding material.

In an embodiment, along the first direction, the support layer may extend further than the barrier layer.

In an embodiment, the cushion layer may have a thickness greater than that of the barrier layer.

In an embodiment, the display device may further include an upper adhesive layer between the display panel and the barrier layer and attached to the barrier layer, and the upper adhesive layer may have a thickness greater than that of the barrier adhesive layer.

In an embodiment, a first distance between the first barrier portion and the second barrier portion may be greater than a second distance between a first sidewall of a first opening that is closest to the non-folding area among the plurality of openings and a second sidewall of a second opening that is furthest from the non-folding area among the plurality of openings.

In an embodiment, a distance between the first barrier portion and the second barrier portion may be greater than a width of the area in which the plurality of openings are defined.

In an embodiment, the non-folding area of the display panel may include a display area. The display device may include a hole overlapping the display area and defined in the support layer, and the cushion layer spaced apart from the hole.

In an embodiment, an electronic device includes a display panel including a foldable area, a barrier layer facing the display panel, a support layer which faces the display panel with the barrier layer therebetween and has a first elastic modulus, a plurality of openings which are defined in the support layer and correspond to the foldable area, and a cushion layer facing the display panel with the support layer therebetween and having a second elastic modulus lower than the first elastic modulus. The cushion layer includes a first cushion layer and a second cushion layer spaced apart from each other at the foldable area of the display panel.

In an embodiment, the electronic device may further include a first barrier adhesive layer attached to both a bottom surface of the barrier layer and to a top surface of the support layer, and a second barrier adhesive layer attached to a top surface of the barrier layer. The first barrier adhesive layer may include a first barrier portion and a second barrier portion spaced apart from each other with the plurality of openings therebetween.

In an embodiment, the first barrier adhesive layer may have a thickness less than that of the second barrier adhesive layer.

In an embodiment, a distance between the first barrier portion and the second barrier portion may be greater than a width of the area in which the plurality of openings are defined.

In an embodiment, the electronic device may further include a first electronic module that overlaps a first hole defined in the display panel and the support layer, and a second electronic module that overlaps a second hole defined in the support layer. The first hole has a depth greater than that of the second hole.

In an embodiment, the cushion layer may be spaced apart from the first hole and the second hole.

In an embodiment, the cushion layer may have a thickness greater than that of the barrier layer.

In an embodiment, a display device includes a display panel including a folding area at which the display panel is foldable and a non-folding area which is adjacent to the folding area along a first direction, a barrier layer facing the display panel, a support layer facing the display panel with the barrier layer therebetween, a plurality of openings defined in the support layer, the plurality of openings corresponding to the folding area of the display panel and including a first opening closest to the non-folding area and a second opening furthest from the non-folding area, and a barrier adhesive layer between the barrier layer and the support layer, the barrier adhesive layer including a first barrier portion and a second barrier portion spaced apart from each other along the first direction at the foldable area by a first distance. The support layer includes along the first direction, a first sidewall which is closest to the non-folding area and defines the first opening, a second sidewall which is furthest from the non-folding area and defines the second opening, and a second distance between the first sidewall and the second sidewall. The first distance between the first barrier portion and the second barrier portion is greater than the second distance between the first sidewall and the second sidewall of the support layer.

In an embodiment, the display device may further include a cushion layer spaced apart from the display panel with the support layer therebetween, and the cushion layer may have an elastic modulus less than that of the support layer.

In an embodiment, the cushion layer may include a first cushion layer and a second cushion layer spaced apart from the first cushion layer by a gap, and the gap between the first cushion layer and the second cushion layer may correspond to the foldable area of the display panel.

In an embodiment, the non-folding area of the display panel may include a display area. The display device may further include a hole that overlaps the display area and defined in the support layer, and the cushion layer spaced apart from the hole.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the invention. In the drawings.

DETAILED DESCRIPTION

Figure 1A:
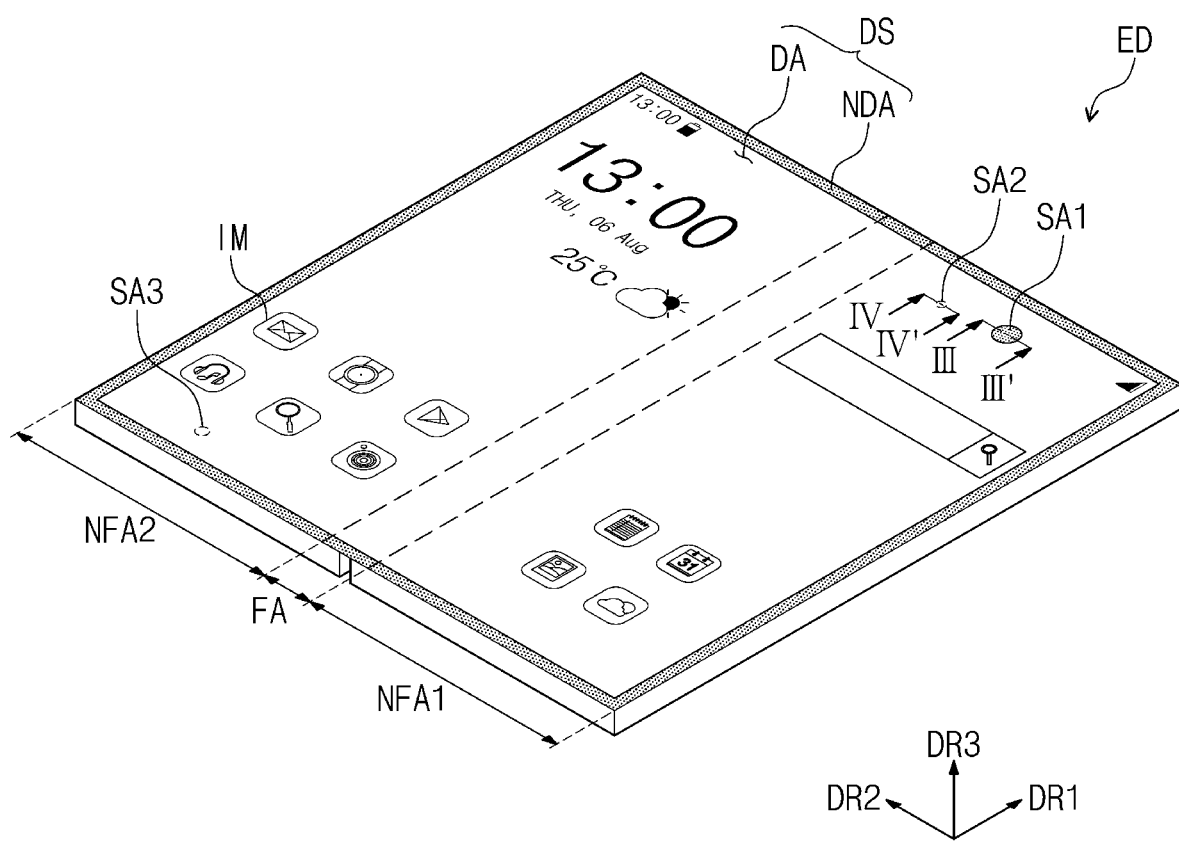
FIGS. 1A and 1B perspective views of an embodiment of an electronic device.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Also, in the figures, the thickness, ratio, and dimensions of components are exaggerated for clarity of illustration. Like reference numerals refer to like elements throughout.

In this specification, it will also be understood that when one component (or region, layer, portion) is referred to as being related to another component such as being "on," "connected to" or "coupled to" another component, it can be directly disposed/connected/coupled on/to the one component, or an intervening third component may also be present. In contrast, when one component (or region, layer, portion) is referred to as being related to another component such as being "directly on," "directly connected to" or "directly coupled to" another component, no intervening third component is present.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a element referred to as a first element in one embodiment can be referred to as a second element in another embodiment without departing from the scope of the appended claims.

Also, "under," "below," "above," "upper" and the like are used for explaining relation association of components illustrated in the drawings. The terms may be a relative concept and described based on directions expressed in the drawings.

The meaning of 'include' or 'comprise' specifies a property, a fixed number, a step, an operation, an element, a component or a combination thereof, but does not exclude other properties, fixed numbers, steps, operations, elements, components or combinations thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described with reference to the accompanying drawings.

Figure 1B:
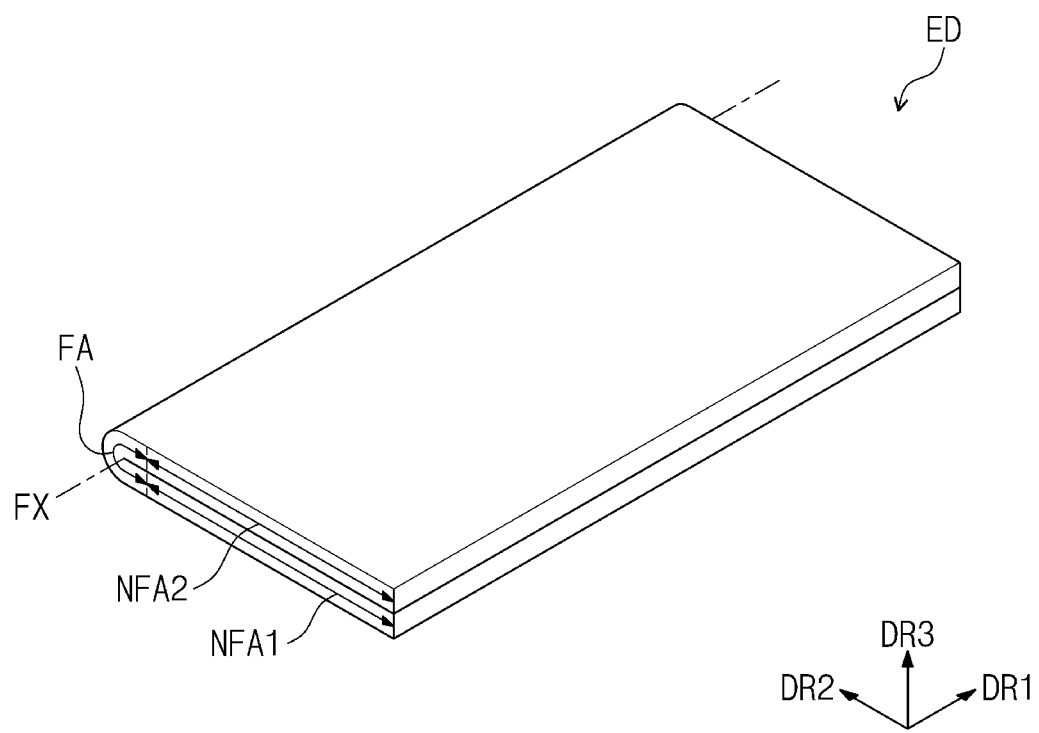

FIGS. 1A and 1B are perspective views of an embodiment of an electronic device ED. FIG. 1A illustrates the electronic device ED which is unfolded (e.g., an unfolded state or in an unfolding state), and FIG. 1B illustrates the electronic device ED which is folded (e.g., in a folded state).

Referring to FIGS. 1A and 1B, the electronic device ED which is flat may include a display surface DS in a plane which is parallel to a plane defined by a first direction DR1 and a second direction DR2 which crosses the first direction DR1. The electronic device ED may display an image IM through the display surface DS.

The display surface DS may include a display area DA and a non-display area NDA which is adjacent to the display area DA. The display area DA may be a planar area at which the image IM is displayed, and the non-display area NDA may be a planar area at which the image IM is not displayed. The non-display area NDA may surround the display area DA in a plan view. However, the invention is not limited thereto. In an embodiment, for example, shapes and arrangements of the display area DA and the non-display area NDA relative to each other may be changed. Various components or layers of the electronic device ED may include a display area DA and a non-display area NDA corresponding to those described for the electronic device ED. In an embodiment, the display area DA and the non-display area NDA together may define a front surface of the electronic device ED. The front surface may have a total planar area including planar areas of both the display area DA and the non-display area NDA, without being limited thereto.

Hereinafter, a direction that crosses a plane defined by the first and second directions DR1 and DR2 is defined as a third direction DR3. The third direction DR3 may cross the plane defined by the first and second directions DR1 and DR2 in a substantially perpendicular manner, without being limited thereto. In this specification, an expression "viewed on a plane" or "along a thickness direction" may be defined as a view along the third direction DR3. Hereinafter, the first to third directions DR1, DR2 and DR3 are indicated by first to third directional axes relative to each other and designated by the same reference numerals, respectively.

The electronic device ED may include a foldable area FA and a non-foldable area provided in plural including a plurality of non-foldable areas. The non-foldable area may be a planar area at which the electronic device ED is not foldable or remains flat even when the electronic device ED is folded at the foldable area FA. The non-foldable areas may include a first non-foldable area NFA1 and a second non-foldable area NFA2. Along the second direction DR2, the foldable area FA may be disposed between the first non-foldable area NFA1 and the second non-foldable area NFA2. The foldable area FA may be referred to as a first area FA, the first non-foldable area NFA1 may be referred to as a second area NFA1, and the second non-foldable area NFA2 may be referred to as a third area NFA2.

As illustrated in FIG. 1B, the foldable area FA may be a planar area at which the electronic device ED is foldable with respect to a folding axis FX parallel to the first direction DR1. The foldable area FA of the electronic device ED which is folded has a curvature and a radius of curvature. The electronic device ED which is folded disposes the first non-foldable area NFA1 and the second non-foldable area NFA2 facing each other. The electronic device ED may be inner-folded or in-folded to dispose portions of the display surface DS facing each other so as to not be facing outside of the electronic device ED.

In an embodiment, the electronic device ED may be outer-folded or out-folded so that portions of the display surface DS face away from each other and face outside of the electronic device ED. In an embodiment, the electronic device ED may be in-foldable and/or out-foldable in a repeated manner. However, the invention is not limited thereto. In an embodiment, the electronic device ED may be only one of in-foldable and out-foldable.

A plurality of sensing areas may be defined in the electronic device ED. Although three sensing areas are exemplarily illustrated in FIG. 1A, the invention is not limited to the number of the sensing areas.

The sensing areas may include a first sensing area SA1, a second sensing area SA2 and a third sensing area SA3. In an embodiment, for example, the first sensing area SA1 may overlap or correspond to an electronic input module or an electronic output module such as a camera module, the second sensing area SA2 may overlap or correspond to an input sensor such as a first illumination sensor, and the third sensing area SA3 may overlap or correspond to an input sensor such as a second illumination sensor. However, the invention is not limited thereto.

Electronic modules (e.g., the camera module, the first illumination sensor or the second illumination sensor) may receive an external input transmitted through a respective sensing area and/or provide an output to outside the electronic device ED through a respective sensing area.

The first sensing area SA1 may be surrounded by the display area DA. A planar area of the display area DA and a planar area of the first sensing area SA1 may together define a total planar area. That is, the first sensing area SA1 is a planar area e of the planar area surrounded by the non-display area NDA except for the display area DA such that the first sensing area SA1 may be a non-display area NDA.

Each of the second and third sensing areas SA2 and SA3 may be in the display area DA. A planar area of the second and third sensing areas SA2 and SA3 may include a corresponding area of the display area DA. That is, the second and third sensing areas SA2 and SA3 may display an image IM such that the second and third sensing areas SA2 and SA3 may be considered a display area DA which is adjacent to the foldable area FA of the display panel DP. Each of the first to third sensing areas SA1, SA2 and SA3 may have a light transmittance greater than that of the display area DA. Also, the first sensing area SA1 may have a light transmittance greater than that of each of the second and third sensing areas SA2 and SA3.

According to an embodiment, the camera module may be surrounded by the display area DA, and each of the first and second illumination sensors may overlap the display area DA. Thus, a planar area occupied by the camera module, the first illumination sensor, and the second illumination sensor is not necessarily provided at the non-display area NDA. As a result, a ratio of the display area DA relative to a total planar area the front surface of the electronic device ED may increase.

Figure 2:
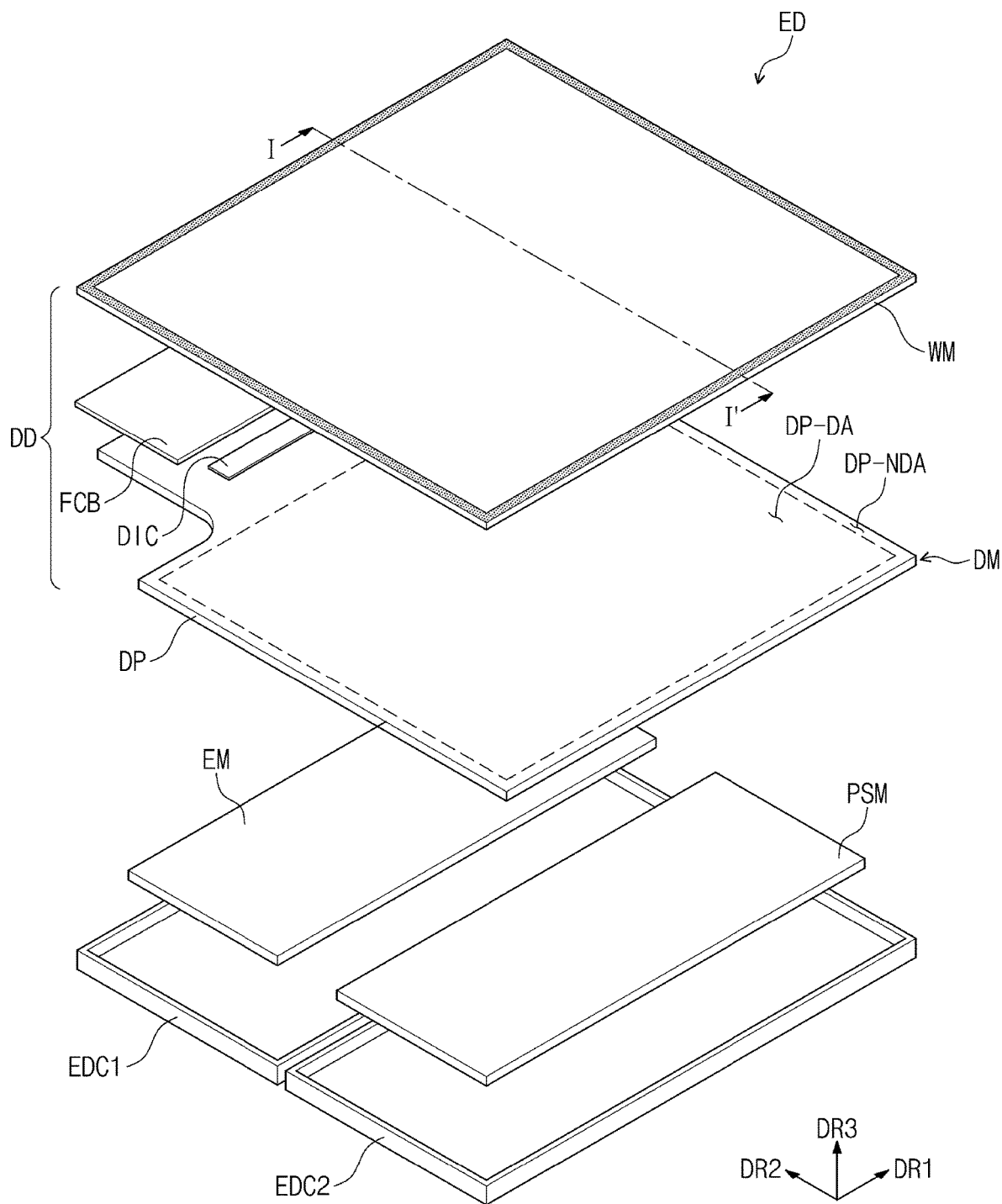
FIG. 2 is an exploded perspective view of an embodiment of an electronic device.

FIG. 2 is an exploded perspective view of an embodiment of the electronic device ED.

Referring to FIG. 2, the electronic device ED may include a display device DD, an electronic module EM, a power module PSM (e.g., power supply), and a case including a first case EDC1 and a second case EDC2. Although not separately shown, the electronic device ED may further include a mechanism structure for controlling folding and/or unfolding of the display device DD.

The display device DD generates an image IM and/or senses an external input. The display device DD includes a window module WM (e.g., window) and a display module DM. The window module WM provides or defines the front surface of the electronic device ED.

The display module DM may include a display panel DP. Although the display module DM is indicated as the same element as the display panel DP in FIG. 2, the display module DM substantially may be a stacked structure in which a plurality of components are laminated. Detailed description on the stacked structure of the display module DM will be described later.

The display panel DP includes a display area DP-DA and a non-display area DP-NDA corresponding to the display area DA (refer to FIG. 1A) and the non-display area NDA (refer to FIG. 1A) of the electronic device ED, respectively. The display area DP-DA may include a pixel at which light is generated, light is emitted, an image IM is displayed, etc. In this specification, an expression "an area corresponds to another area" represents that an area overlaps another area, while not being limited to a same planar area. The display module DM may include a driving chip DIC disposed in the non-display area DP-NDA. The display module DM may include a flexible circuit film FCB coupled to the display panel DP at the non-display area DP-NDA. The driving chip DIC and the flexible circuit film FCB may be connected to the display panel DP. An electrical signal may be provided to the display panel DP from outside thereof through the driving chip DIC and/or the flexible circuit film FCB. Conversely, an electrical signal may be provided from the display panel DP to outside thereof through the driving chip DIC and/or the flexible circuit film FCB.

The driving chip DIC may include a driving element for driving a pixel of the display panel DP, e.g., a data driving circuit. Although a structure of the driving chip DIC mounted on the display panel DP is illustrated in FIG. 2, the invention is not limited thereto. In an embodiment, for example, the driving chip DIC may be mounted on the flexible circuit film FCB.

The electronic module EM includes a main controller. The electronic module EM may include one or more of a wireless communication module, a camera module, a proximity sensor module, an image input module, a sound input module, a sound output module, a memory and an external interface module. The electronic module EM may be electrically connected to the power module PSM.

The main controller controls an overall operation of the electronic device ED. In an embodiment, for example, the main controller activates or deactivates the display device DD in accordance with an external input from outside the electronic device ED. The main controller may control an operation of display device DD and other modules within the electronic device ED. The main controller may include a micro-processor.

The case accommodates the display module DM, the electronic module EM and the power module PSM. Although two cases including the first case EDC1 and the second case EDC2 that are separated from each other are exemplarily illustrated, the invention is not limited thereto. Although not shown, the electronic device ED may further include a hinge structure for connecting the first case EDC1 and the second case EDC2. The first case EDC1 and the second case EDC2 may be coupled to the window module WM. The first case EDC1 and the second case EDC2 protect components such as the display module DM, the electronic module EM and the power module PSM accommodated therein.

Figure 3:
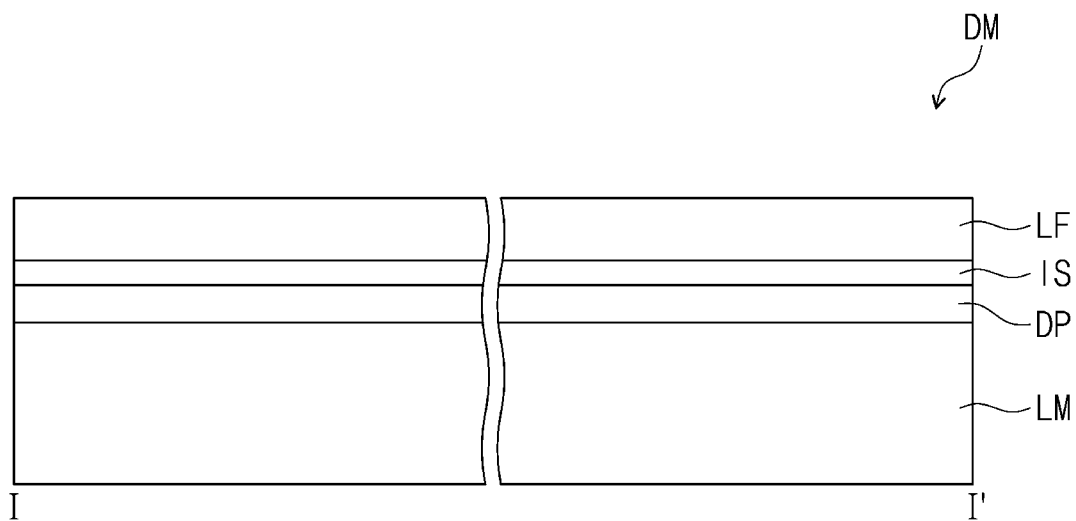
FIG. 3 is a cross-sectional view of an embodiment of a display module of FIG. 2.
Figure 3:
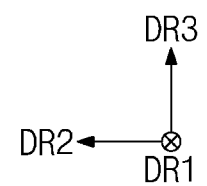

FIG. 3 is a cross-sectional view of an embodiment of the display module DM. FIG. 3 is a cross-sectional view taken along line I-I' of FIG. 2.

Referring to FIG. 3, the display module DM may include a display panel DP, an input sensor IS (e.g., input-sensing layer) disposed on the display panel DP, an optical film LF disposed on the input sensor IS, and a lower member LM disposed below the display panel DP. An adhesive layer may be disposed between the above-described members as necessary.

The display panel DP may include a base layer, a circuit element layer disposed on the base layer, a display element layer disposed on the circuit element layer, and a thin-film encapsulation layer disposed on the display element layer. The base layer may include a plastic film. In an embodiment, for example, the base layer may include polyimide. Substantially, the base layer may have the same planar shape as the display panel DP in FIG. 4 that will be described later.

The circuit element layer of the display panel DP may include an organic layer, an inorganic layer, a semiconductor pattern, a conductive pattern and a signal line (e.g., electrical signal line). The organic layer, the inorganic layer, the semiconductor layer and the conductive layer may be provided on the base layer by a method such as coating and deposition. Thereafter, the organic layer, the inorganic layer, the semiconductor layer and the conductive layer may be selectively patterned such as through a plurality of photolithography processes to provide the semiconductor pattern, the conductive pattern and the signal line.

The semiconductor pattern, the conductive pattern and the signal line may constitute signal lines SL1-SLm, DL1-DLn, EL1-ELm, CSL1, CSL2, and PL and a pixel driving circuit of one or more pixels PX of the display panel DP in FIG. 4 that will be described later. The pixel driving circuit may include a transistor.

The display element layer of the display panel DP includes a light emitting element of the pixels PX in FIG. 4 that will be described later. The light emitting element is electrically connected to the transistor. The thin-film encapsulation layer is disposed on the display element layer to seal the display element layer. The thin-film encapsulation layer may include an inorganic layer, an organic layer and an inorganic layer, which are sequentially stacked. However, the invention is not limited to the stacked structure of the thin-film encapsulation layer.

The input sensor IS may include a plurality of sensing electrodes (not shown) for sensing an external input, conductive trace lines (not shown) connected to the plurality of sensing electrodes, and an inorganic layer and/or an organic layer for insulating/protecting the plurality of sensing electrodes or the conductive trace lines. Although the input sensor IS may be a capacitive sensor, the invention is not limited thereto.

The input sensor IS may be directly provided or formed on the thin-film encapsulation layer of the display panel DP such as through a continuous process when the display panel DP is provided or manufactured. In this specification, the input sensor IS integrated with display panel DP through the continuous process may be defined as an electronic panel. However, the invention is not limited thereto. In an embodiment, for example, the input sensor IS may be provided or manufactured on a panel separate from the display panel DP and then attached to the display panel DP such as by using an adhesive layer.

Figure 4:
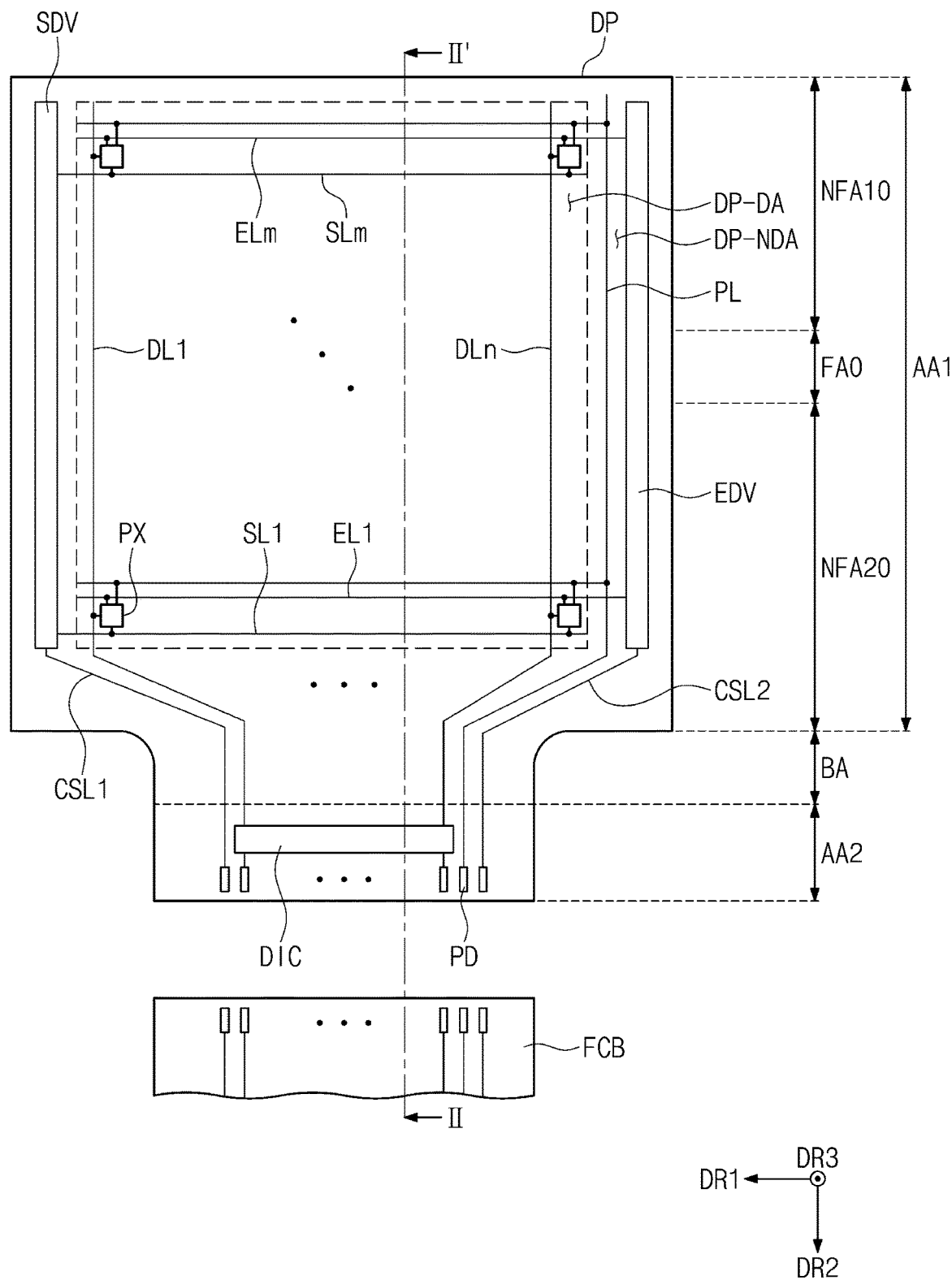
FIG. 4 is a plan view of an embodiment of a display panel.

The plurality of sensing electrodes of the input sensor IS overlap the display area DP-DA (refer to FIG. 4). The conductive trace lines of the input sensor IS overlap the non-display area DP-NDA (refer to FIG. 4). The conductive trace lines may pass through a bending area BA (refer to FIG. 4) and extend toward a lower end of a second panel area AA2 so that the conductive trace lines are adjacent to a pad PD provided in plural including a plurality of pads PD in FIG. 4. Here, the conductive trace lines of the input sensor IS may be disposed in or on a layer different from the signal lines SL1-SLm, DL1-DLn, EL1-ELm, CSL1, CSL2, and PL (refer to FIG. 4) of the circuit element layer of the display panel DP.

The conductive trace lines of the input sensor IS may be connected to input signal lines of the display panel DP in a first panel area AA1 in FIG. 4. Although the input signal lines are different from the signal lines SL1-SLm, DL1-DLn, EL1-ELm, CSL1, CSL2, and PL in FIG. 4, the input signal lines may be disposed in or on the same layer as one or more of the signal lines SL1-SLm, DL1-DLn, EL1-ELm, CSL1, CSL2, and PL of the display panel DP. As being in a same layer, elements may be respective patterns of a same material layer.

Each of the input signal lines may be connected to a corresponding one of the pads PD (refer to FIG. 4). As a result, the conductive trace lines of the input sensor IS may be electrically connected to the same flexible circuit film FCB (refer to FIG. 4) as the signal lines SL1-SLm, DL1-DLn, EL1-ELm, CSL1, CSL2, and PL of the circuit element layer of the display panel DP.

The optical film LF may reduce a reflectance of external light. The optical film LF may include a retarder and/or a polarizer. The optical film LF may include a polarizing film.

The optical film LF may include color filters in a color filter layer. The color filters may have an arrangement. The arrangement of the color filters may be determined in consideration of emitted colors of the pixels PX in the display panel DP. Also, the optical film LF may further include a black matrix.

The optical film LF may include a destructive interference structure. In an embodiment, for example, the destructive interference structure may include a first reflection layer and a second reflection layer which are disposed in different layers from each other. First reflected light and second reflected light which are reflected from the first reflection layer and the second reflection layer, respectively, may be destructively interfered with each other, and thus, the reflectance of external light may decrease.

The lower member LM may include various functional members. The lower member LM may include a light blocking layer that blocks incident light, an impact absorbing layer that absorbs an external impact, a support layer supporting the display panel DP and/or a heat dissipation layer dissipating heat generated from the display panel DP. Detailed description on the stacked structure of the lower member LM will be described later.

FIG. 4 is a plan view of an embodiment of the display panel DP. The display panel DP in FIG. 4 is flat or unfolded.

Referring to FIG. 4, the display panel DP may include a display area DP-DA and a non-display area DP-NDA which is adjacent to the display area DP-DA. The display area DP-DA and the non-display area DP-NDA may be distinguished as including or excluding a pixel PX, respectively. The pixel PX is disposed in the display area DP-DA. A scan driving part SDV, a data driving part and an emission driving part EDV may be disposed in the non-display area DP-NDA. The data driving part may be a partial circuit in the driving chip DIC.

The display panel DP further includes a first panel area AA1, a second panel area AA2 and a bending area BA which are planar areas distinguished from each other along the second direction DR2. Each of the bending area BA and the second panel area AA2 may be a partial area of the non-display area DP-NDA. The display panel DP may include the first panel area AA1, the bending area BA and the second panel area AA2 in order along the second direction DR2.

The first panel area AA1 corresponds to the display surface DS in FIG. 1A. The first panel area AA1 may include a first non-folding area NFA10, a second non-folding area NFA20 and a folding area FA0. The first non-folding area NFA10, the second non-folding area NFA20 and the folding area FA0 correspond to the first non-foldable area NFA1, the second non-foldable area NFA2, and the foldable area FA in FIGS. 1A and 1B, respectively. The folding area FA0 may be referred to as a first area FA0, the first non-folding area NFA10 may be referred to as a second area NFA10, and the second non-folding area NFA20 may be referred to as a third area NFA20.

Along the first direction DR1, each of the bending area BA and the second panel area AA2 may have a dimension such as a length less than a length of the first panel area AA1. The length may be a maximum dimension along the first direction DR1 without being limited thereto. A bending axis may be defined along the first direction DR1. The display panel DP may be bendable at the bending area BA along the bending axis. An area of the display panel DP having a relatively shorter length along the bending axis direction may be easily bendable.

The display panel DP may include a plurality of pixels PX, a plurality of scan lines SL1 to SLm, a plurality of data lines DL1 to DLn, a plurality of emission lines EL1 to ELm, first and second control lines CSL1 and CSL2, a power line PL, and a plurality of pads PD. Here, reference numerals 'm' and 'n' are natural numbers. The pixels PX may be connected to corresponding ones of the scan lines SL1 to SLm, the data lines DL1 to DLn, and the emission lines EL1 to ELm.

The scan lines SL1 to SLm may each extend along the first direction DR1 and be electrically connected to the scan driving part SDV. The data lines DL1 to DLn may each extend along the second direction DR2 and through the bending area BA and be electrically connected to the driving chip DIC at the second panel area AA2. The emission lines EL1 to ELm may each extend along the first direction DR1 and be electrically connected to the emission driving part EDV.

The power line PL may include a portion extending along the first direction DR1 and a portion extending along the second direction DR2. The portion extending along the first direction DR1 and the portion extending along the second direction DR2 may be disposed in or on different layers from each other. The portion extending along the second direction DR2 may extend to the second panel area AA2 through the bending area BA from the first panel area AA1. The power line PL may provide a first voltage to the pixels PX.

The first control line CSL1 may be connected to the scan driving part SDV and extend toward the lower end of the second panel area AA2 through the bending area BA. The second control line CSL2 may be connected to the emission driving part EDV and extend toward the lower end of the second panel area AA2 through the bending area BA.

When viewed from a plane, the pads PD may be disposed adjacent to the lower end of the second panel area AA2 (e.g., a distal end of the display panel DP). The driving chip DIC, the power line PL, the first control line CSL1 and the second control line CSL2 may be electrically connected to a respective pad among the pads PD. The flexible circuit film FCB external to the display panel DP may be electrically connected to the display panel DP at the pads PD, through an anisotropic conductive adhesive layer.

Figure 5:
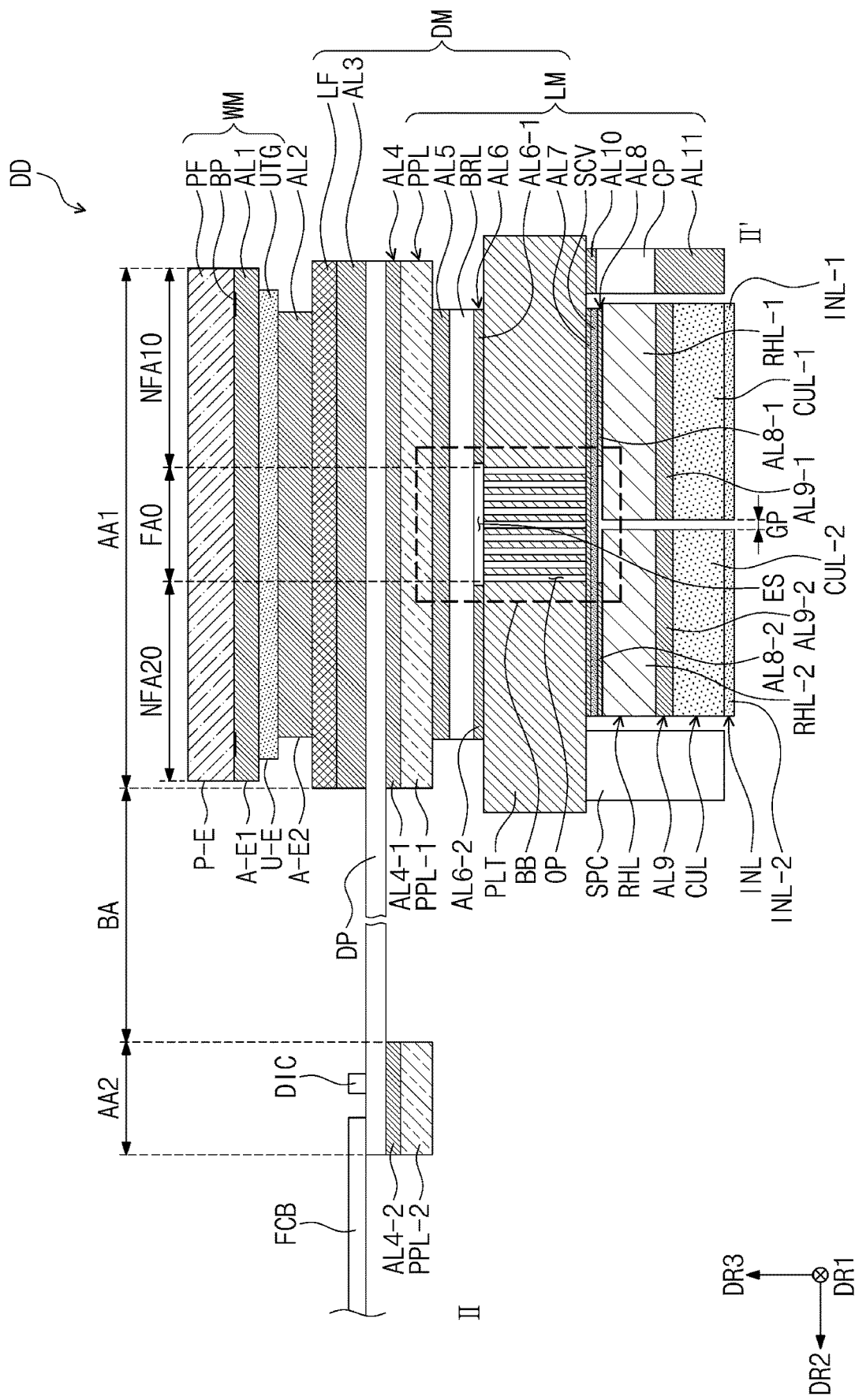
FIG. 5 is a cross-sectional view of an embodiment of the display device of FIG. 4.
Figure 6:
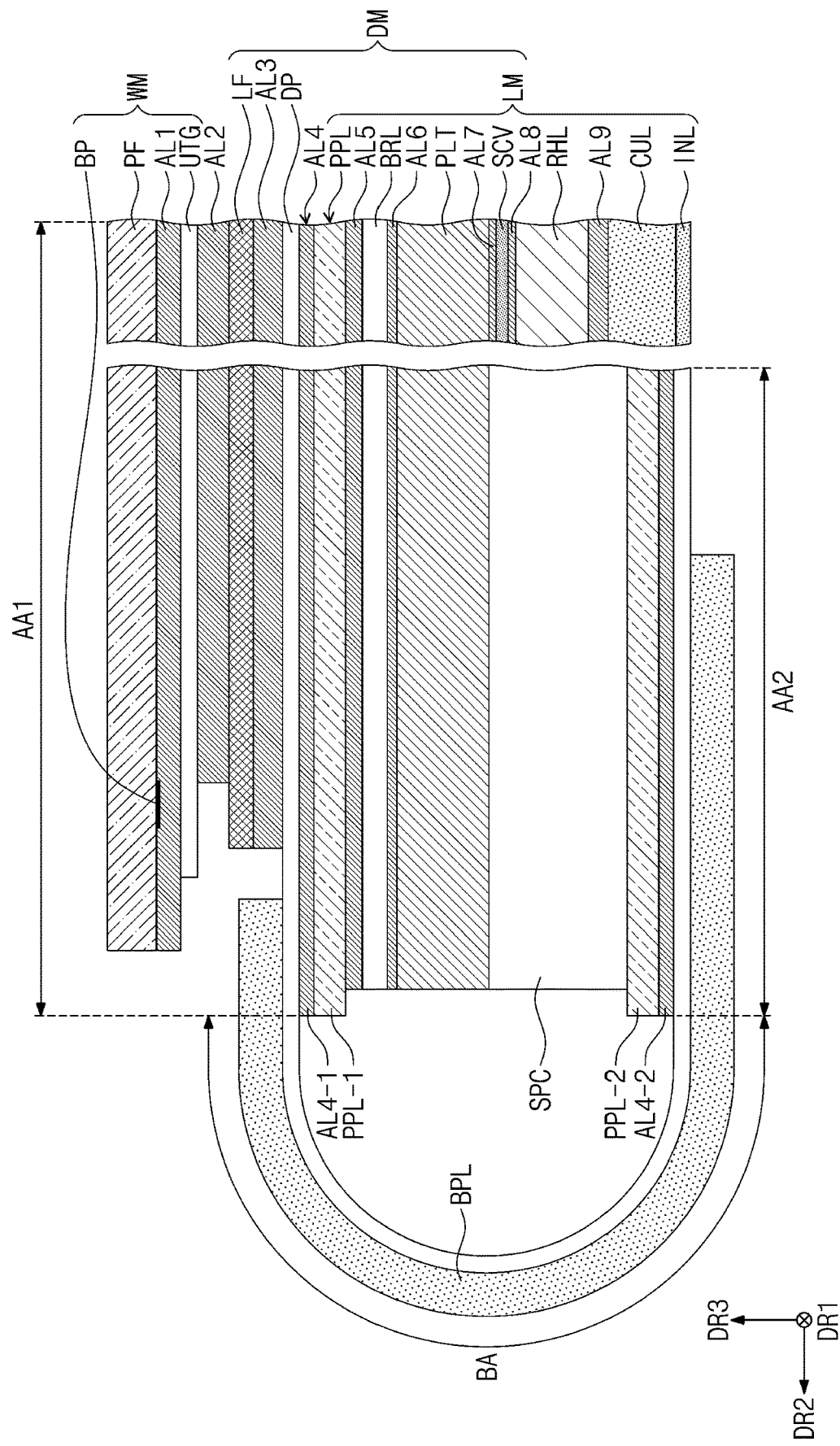
FIG. 6 is a cross-sectional view of an embodiment of the display device.

FIG. 5 is a cross-sectional view of an embodiment of the display device DD which is flat. FIG. 5 is a cross-sectional view taken along line II-IP of FIG. 4. FIG. 6 is a cross-sectional view of an embodiment of the display device DD which is bend or folded at the bending area BA.

FIG. 5 illustrates the display device DD before installation thereof into the electronic device ED (refer to FIG. 1A), and FIG. 6 illustrates the display device DD which is installed into the electronic device ED (refer to FIG. 1A).

Referring to FIG. 6, when the display device DD is installed into the electronic device ED (refer to FIG. 1A), the first panel area AA1 and the second panel area AA2 of the display panel DP may be disposed in planes different from each other. The second panel area AA2 may be disposed below the first panel area AA1 along the third direction DR3.

Referring to FIGS. 5 and 6, the window module WM may include a thin-film glass substrate UTG, a plastic film PF disposed on the thin-film glass substrate UTG, a first adhesive layer AL1 coupling the thin-film glass substrate UTG and the plastic film PF and a bezel pattern BP.

The bezel pattern BP overlaps the non-display area NDA in FIG. 1A. The bezel pattern BP may be disposed on one surface of the thin-film glass substrate UTG or one surface of the plastic film PF. FIG. 5 exemplarily illustrates the bezel pattern BP disposed on a rear surface of the plastic film PF. However, the invention is not limited thereto. The bezel pattern BP may be disposed on a top surface of the plastic film PF. The bezel pattern BP may be a colored light blocking layer provided by, e.g., a coating method. The bezel pattern BP may include a base material and a dye or a pigment which is combined with the base material. The bezel pattern BP may have a closed line shape in a plan view.

The thin-film glass substrate UTG may have a thickness of about 15 μm (micrometers) to about 45 μm, e.g., about 30 μm. The thin-film glass substrate UTG may be chemical reinforced glass. As the thin-film glass substrate UTG is applied, generation of a wrinkle may be minimized although folding and unfolding of the display device DD are repeated. In an embodiment, a synthetic resin film may be applied instead of the thin-film glass substrate UTG.

The plastic film PF may have a thickness of about 50 μm to about 80 μm, e.g., about 65 μm. The plastic film PF may include polyimide, polycarbonate, polyamide, triacetylcellulose, polymethylmethacrylate or polyethylene terephthalate. Although not separately shown, at least one of a hard coating layer, an anti-fingerprint layer and an anti-reflection layer may be disposed on the top surface of the plastic film PF.

The first adhesive layer AL1 may be a pressure sensitive adhesive ("PSA") or an optically clear adhesive ("OCA").

The adhesive layers described below may be the same as the first adhesive layer AL1 and include one or more of the adhesive materials described above.

The first adhesive layer AL1 may have a thickness of about 20 μm to about 50 μm, e.g., about 35 μm. The first adhesive layer AL1 may have a thickness capable of covering the bezel pattern BP. In an embodiment, for example, the bezel pattern BP may have a thickness of about 3 μm to about 8 μm, and the first adhesive layer AL1 may have a thickness capable of reducing or effectively preventing bubbles generated around the bezel pattern BP.

The first adhesive layer AL1 may be separated (e.g., removably disposed or separable) from the thin-film glass substrate UTG. Since the plastic film PF has strength less than the thin-film glass substrate UTG, scratches may be easily generated in the plastic film PF. The first adhesive layer AL1 and the plastic film PF may be separated together, and then a new one of the plastic film PF may be attached to the thin-film glass substrate UTG.

On the plane (e.g., along the third direction DR3), an edge U-E (e.g., outer edge) of the thin-film glass substrate UTG is not overlapped with the bezel pattern BP. As the above-described condition is satisfied, the edge U-E of the thin-film glass substrate UTG may be exposed from the bezel pattern BP, and a micro-crack generated at the edge U-E of the thin-film glass substrate UTG may be inspected through an inspection device since the edge U-E of the thin-film glass substrate UTG is visually exposed outside the bezel pattern BP. The inspection device may include a microscope. A crack initiated from the edge U-E of the thin-film glass substrate UTG may be checked by photographing the edge U-E of the thin-film glass substrate UTG from above the top surface of the plastic film PF using the inspection device, since visibility of the edge U-E is not blocked by the bezel pattern BP.

On the plane, an edge P-E of the plastic film PF and an edge A-E1 of the first adhesive layer AL1 may be aligned with each other. The plastic film PF and the first adhesive layer AL1 may have the same planar area and the same planar shape as each other.

The window module WM and the display module DM may be coupled to each other by the second adhesive layer AL2. The second adhesive layer AL2 may include a pressure sensitive adhesive or a transparent adhesive such as the optically clear adhesive. The second adhesive layer AL2 may have a thickness of about 35 μm to about 65 μm, e.g., about 50 μm.

On the plane, an edge A-E2 of the second adhesive layer AL2 may overlap the window module WM. In an embodiment, for example, the edge A-E2 of the second adhesive layer AL2 may overlap the thin-film glass substrate UTG. In a process of attaching the window module WM and the display module DM to each other, a pressure may be applied to the second adhesive layer AL2. The second adhesive layer AL2 may receive a pressure and be stretched in a direction parallel to the first direction DR1 and/or the second direction DR2. Here, the second adhesive layer AL2 in the display device DD which is flat has a planar area less than that of the thin-film glass substrate UTG so that the second adhesive layer AL2 which is stretched does not protrude further than the edge U-E of the thin-film glass substrate UTG.

When the first adhesive layer AL1 and the second adhesive layer AL2 are attached between respective layers, during a folding of the electronic device ED (refer to FIG. 1A), a buckling phenomenon or a crack may be generated in the thin-film glass substrate UTG because the thin-film glass substrate UTG does not slip or move. However, according to an embodiment, since the second adhesive layer AL2 has the planar area less than that of the thin-film glass substrate UTG, the first adhesive layer AL1 and the second adhesive layer AL2 at opposing sides of the thin-film glass substrate UTG may not be attached to each other, and a probability of foreign substances attached to the second adhesive layer AL2 may decrease.

The display module DM may include an optical film LF, a display panel DP, a panel protection layer PPL, a barrier layer BRL, a support layer PLT, a cover layer SCV, a heat dissipation layer RHL, a cushion layer CUL, an insulation layer INL, a spacer SPC, a step compensation pattern CP, and third to eleventh adhesive layers AL3 to AL11. The third to eleventh adhesive layers AL3 to AL11 may include a pressure sensitive adhesive or a transparent adhesive such as an optically clear adhesive. In an embodiment, some of the above-described components may be omitted. In an embodiment, for example, the step compensation pattern CP and the tenth and eleventh adhesive layers AL10 and AL11 which are related to the step compensation pattern CP may be omitted.

The optical film LF is disposed in the first panel area AA1. The optical film LF covers at least the display area DP-DA (refer to FIG. 2). The second adhesive layer AL2 couples the optical film LF to the window module WM, and the third adhesive layer AL3 couples the optical film LF to the display panel DP. Although only the display panel DP is illustrated in FIGS. 5 and 6, the input sensor IS may be further disposed between the display panel DP and the third adhesive layer AL3 as illustrated in FIG. 3.

The panel protection layer PPL may be disposed below the display panel DP. The panel protection layer PPL may protect a lower portion of the display panel DP. The panel protection layer PPL may include a flexible plastic material. The panel protection layer PPL may reduce or effectively prevent scratches from being generated on a rear surface of the display panel DP in a process of manufacturing the display panel DP. The panel protection layer PPL may be a colored polyimide film. In an embodiment, for example, the panel protection layer PPL may be an opaque yellow film. However, the invention is not limited thereto.

In an embodiment, the panel protection layer PPL may not be disposed in (e.g., may be excluded from) the bending area BA. The panel protection layer PPL may include a first panel protection layer PPL-1 protecting the first panel area AA1 of the display panel DP and a second panel protection layer PPL-2 protecting the second panel area AA2.

In the display device DD which is bent at the bending area BA, the second panel protection layer PPL-2 may be disposed below the first panel protection layer PPL-1 and the first panel area AA1 together with the second panel area AA2 of the display panel DP. Since the panel protection layer PPL is not disposed in the bending area BA, the display device DD may be easily bent at the bending area BA.

The fourth adhesive layer AL4 may couple the panel protection layer PPL and the display panel DP to each other. The fourth adhesive layer AL4 may include a first portion AL4-1 corresponding to the first panel protection layer PPL-1 and a second portion AL4-2 corresponding to the second panel protection layer PPL-2. The first portion AL4-1 may couple the first panel protection layer PPL-1 to the first panel area AA1 of the display panel DP, and the second portion AL4-2 may couple the second panel protection layer PPL-2 to the second panel area AA2 of the display panel DP.

The barrier layer BRL may be disposed below the panel protection layer PPL. The fifth adhesive layer AL5 may be disposed between the panel protection layer PPL and the barrier layer BRL to couple the barrier layer BRL to the panel protection layer PPL. The fifth adhesive layer AL5 may be attached to a top surface of the barrier layer BRL. Thus, the fifth adhesive layer AL5 may be referred to as an upper adhesive layer.

The barrier layer BRL may increase a resistance against a compression force caused by external pressing. Thus, the barrier layer BRL may reduce or effectively prevent the display panel DP from being deformed. The barrier layer BRL may include a flexible plastic material such as polyimide or polyethylene terephthalate.

Also, the barrier layer BRL may absorb light incident from outside the display device DD. The barrier layer BRL may include a light shielding material or be a colored film having a low light transmittance. In an embodiment, for example, the barrier layer BRL may be a black plastic film, e.g., a black polyimide film. When the display module DM is viewed from above the window module WM (e.g., in a direction opposite to the third direction DR3), components disposed below the barrier layer BRL may not be recognized from outside the display module DM.

The support layer PLT is disposed below the barrier layer BRL. The support layer PLT faces both the folding area FA0 and the non-folding area NFA10 and NFA20. The support layer PLT may include a material having an elastic modulus of about 60 gigapascals (GPa) or more. The support layer PLT may include a metal material such as stainless steel. Although the support layer PLT may include SUS 304 as an example, the invention is not limited thereto. In an embodiment, for example, the support layer PLT may include various metal materials. The support layer PLT may support the display panel DP. Also, the support layer PLT may improve a heat dissipation performance of the display device DD.

An opening OP may be provided in plural including a plurality of openings OP defined in a partial area of the support layer PLT which corresponds to the folding area FA0. The support layer PLT may have improved flexibility by the openings OP.

The barrier layer BRL may have a planar area less than that of the support layer PLT. The planar areas may be in the display device DD which is flat or unfolded and defined in a plane defined by the first direction DR1 and the second direction DR2 which cross each other. On the plane, the barrier layer BRL may overlap a portion of the support layer PLT. Another portion of the support layer PLT may not overlap the barrier layer BRL. That is, the support layer PLT extends further than the barrier layer BRL.

The sixth adhesive layer AL6 may be disposed between the barrier layer BRL and the support layer PLT. The sixth adhesive layer AL6 may couple the barrier layer BRL and the support layer PLT to each other. The sixth adhesive layer AL6 (hereinafter, referred to as a barrier adhesive layer) may include a first barrier portion AL6-1 and a second barrier portion AL6-2 which are spaced apart from each other. The first barrier portion AL6-1 and the second barrier portion AL6-2 are disconnected from each other at the folding area FA0.

The first barrier portion AL6-1 and the second barrier portion AL6-2 may be spaced apart from each other with the plurality of openings OP therebetween. On the plane, the barrier adhesive layer AL6 may not overlap the plurality of openings OP. Also, on the plane, an inner edge of the barrier adhesive layer AL6 may be spaced apart from the plurality of openings OP.

The first barrier portion AL6-1 may overlap the second area NFA10, the second barrier portion AL6-2 may overlap the third area NFA20, and each of the first barrier portion AL6-1 and the second barrier portion AL6-2 may not overlap the first area FA0. As the barrier adhesive layer AL6 is not disposed corresponding to the first area FA0, the support layer PLT may have improved flexibility.

In the area overlapping or corresponding to the first area FA0, the barrier layer BRL may be spaced apart from the support layer PLT along the third direction DR3. That is, a first space ES may be defined between the support layer PLT and the barrier layer BRL in the area overlapping the first area FA0. Air may be disposed in the first space ES.

Since the first space ES is defined between the support layer PLT and the barrier layer BRL in the electronic device ED (refer to FIG. 1A) which is unfolded, the plurality of openings OP defined in the support layer PLT may not be recognizable from outside of the electronic device ED (refer to FIG. 1A).

Also, as the barrier layer BRL include the light shielding material, or the colored film having a low light transmittance is applied as the barrier layer BRL, a color difference of the support layer PLT may not be recognized from outside the electronic device ED. In an embodiment, for example, a color difference between a first support area of the support layer PLT in which the plurality of openings OP are defined and a second support area of the support layer PLT in which the plurality of openings OP are not defined may not be recognized from outside the electronic device ED. The first support area may overlap the first area FA0, and the second support area may overlap the second area NFA10 and the third area NFA20.

The barrier adhesive layer AL6 may have a thickness less than that of the fifth adhesive layer AL5. In an embodiment, for example, the fifth adhesive layer AL5 may have a thickness of about 25 μm, and the barrier adhesive layer AL6 may have a thickness of about 16 μm.

As the thickness of the barrier adhesive layer AL6 decreases, a stepped portion caused by the barrier adhesive layer AL6 may decrease. Although shape deformation of the stacked structures caused by folding and unfolding of the electronic device ED (refer to FIG. 1A) is reduced as the stepped portion decreases, recognition of the plurality of openings OP may increase or delamination of the barrier adhesive layer AL6 may increase by the repeated folding operation. In contrast, although the plurality of openings OP may not be recognized as the thickness of the barrier adhesive layer AL6 increases and reliability on the adhesive force of the barrier adhesive layer AL6 by the repeated folding operation may increase, the stepped portion may increase. Thus, the thickness of the barrier adhesive layer AL6 may be selected within an appropriate range in consideration of folding reliability, adhesion reliability, and possibility of recognition of the plurality of openings OP.

The seventh adhesive layer AL7 (hereinafter, referred to as a first cover adhesive layer) may be disposed below the support layer PLT, and the cover layer SCV may be disposed below the first cover adhesive layer AL7. The support layer PLT and the cover layer SCV may be coupled to each other by the first cover adhesive layer AL7. The cover layer SCV may be provided or manufactured as a sheet shape and attached to the support layer PLT.

The first cover adhesive layer AL7 and the cover layer SCV may cover the plurality of openings OP defined in the support layer PLT. Thus, the cover layer SCV may reduce or effectively prevent foreign substances from being introduced to the plurality of openings OP. The cover layer SCV may have an elastic modulus less than that of the support layer PLT. In an embodiment, for example, the cover layer SCV may include a thermoplastic polyurethane, rubber or silicon. However, the invention is not limited thereto.

The eighth adhesive layer AL8 (hereinafter, referred to as a second cover adhesive layer) may be disposed below the cover layer SCV. The second cover adhesive layer AL8 may include a first cover portion AL8-1 and a second cover portion AL8-2. The first cover portion AL8-1 and the second cover portion AL8-2 may be spaced apart from each other. On the plane, first cover portion AL8-1 and the second cover portion AL8-2 may be spaced apart from each other with the plurality of openings OP therebetween. The first cover portion AL8-1 and the second cover portion AL8-2 may not overlap each other in the first area FA0 (e.g., may be disconnected from each other at the folding area FA0).

The heat dissipation layer RHL may be disposed below the second cover adhesive layer ALB. The heat dissipation layer RHL may be a sheet having a high thermal conductivity. The heat dissipation layer RHL may include metal or metal alloy, e.g., copper, copper alloy, or graphite.

The heat dissipation layer RHL may include a first heat dissipation layer RHL-1 and a second heat dissipation layer RHL-2. The first heat dissipation layer RHL-1 and the second heat dissipation layer RHL-2 may be spaced apart from each other by a gap GP. Along the second direction DR2, the gap GP may be about 0.4 mm (millimeter) to about 2.4 mm (millimeters). However, the invention is not limited thereto. The gap GP may be disposed in correspondence to the folding area FA0.

The first heat dissipation layer RHL-1 may be coupled to the cover layer SCV through the first cover portion AL8-1, and the second heat dissipation layer RHL-2 may be coupled to the cover layer SCV through the second cover portion AL8-2. On the plane, the first heat dissipation layer RHL-1 may overlap the second area NFA10 and a portion of the first area FA0, and the second heat dissipation layer RHL-2 may overlap the third area NFA20 and another portion of the first area FA0.

On the plane, one portion of the first heat dissipation layer RHL-1 may overlap one portion of the plurality of openings OP, and one portion of the second heat dissipation layer RHL-2 may overlap another portion of the plurality of openings OP. The first heat dissipation layer RHL-1 and the second heat dissipation layer RHL-2 may serve to support the support layer PLT. In an embodiment, for example, the area in which the plurality of openings OP is defined of the support layer PLT may be supported by the first heat dissipation layer RHL-1 and the second heat dissipation layer RHL-2. Thus, the first heat dissipation layer RHL-1 and the second heat dissipation layer RHL-2 may be referred to as a first lower support layer and a second lower support layer, respectively.

The ninth adhesive layer AL9 may be disposed below the heat dissipation layer RHL. The ninth adhesive layer AL9 may include a first portion AL9-1 corresponding to the first heat dissipation layer RHL-1 and a second portion AL9-2 corresponding to the second heat dissipation layer RHL-2. The first portion AL9-1 and the second portion AL9-2 may be spaced apart from each other by the gap GP.

The cushion layer CUL may be disposed below the ninth adhesive layer AL9. Although the cushion layer CUL may have a thickness of about 75 μm, the invention is not limited thereto. The cushion layer CUL may protect the display panel DP by absorbing an external impact. The cushion layer CUL may have an elastic modulus less than that of the support layer PLT. The cushion layer CUL may include a foam sheet having an elastic force. The cushion layer CUL may include a sponge or polyurethane.

The cushion layer CUL may include a first cushion layer CUL-1 corresponding to the first portion AL9-1 and a second cushion layer CUL-2 corresponding to the second portion AL9-2. The first cushion layer CUL-1 and the second cushion layer CUL-2 may be spaced apart from each other by the gap GP. On the plane, the gap GP between the first cushion layer CUL-1 and the second cushion layer CUL-2 may overlap the first area FA0. On the plane, the first cushion layer CUL-1 may overlap the second area NFA10 and one portion of the first area FA0, and the second cushion layer CUL-2 may overlap the third area NFA20 and another portion of the first area FA0.

In a comparative example, when the cushion layer CUL is disposed between the support layer PLT and the display panel DP, a shape of the cushion layer CUL may be deformed when the display panel DP is pressed, and thus the display panel DP may be easily deformed. However, according to one or more embodiment, the cushion layer CUL faces the display panel DP with the support layer PLT therebetween. Thus, when the display panel DP is pressed, deformation of the display panel DP may decrease in comparison with the comparative example. Also, as the cushion layer CUL is disposed below the heat dissipation layer RHL, an impact absorption performance of the cushion layer CUL may improve.

The insulation layer INL may be disposed below the cushion layer CUL. The insulation layer INL may include a first insulation layer INL-1 corresponding to the first cushion layer CUL-1 and a second insulation layer INL-2 corresponding to the second cushion layer CUL-2. In FIG. 5, the insulation layer INL includes an insulating tape. The insulation layer INL may reduce or effectively prevent static electricity from being introduced. Although not shown in FIG. 5, the flexible circuit film FCB may be disposed corresponding to the insulation layer INL in the electronic device ED which is folded or bent. The insulation layer INL may reduce or effectively prevent electrical interference to the flexible circuit film FCB from other members disposed on the insulation layer INL.

A first surface of the step compensation pattern CP may be coupled to the support layer PLT through the tenth adhesive layer AL10. The eleventh adhesive layer AL11 is disposed on a second surface which is opposite to the first surface of the step compensation pattern CP. The eleventh adhesive layer AL11 may be used when the display device DD (refer to FIG. 2) is coupled with another component of the electronic device ED (refer to FIG. 2).

Referring to FIG. 6, the display device DD which is bent at the bending area BA disposes the second panel area AA2 below the first panel area AA1. Thus, the driving chip DIC (refer to FIG. 5) may be disposed below the first panel area AA1. That is, the first panel area AA1 and the second panel area AA2 may be disposed in different planes or on different reference surfaces from each other. The bending area BA may be bent convexly in a transverse direction on a cross-section. The bending area BA may define an end portion of the display device DD which is bent. The display device DD which is bent has a curvature and a radius of curvature at the bending area BA. The radius of curvature may be about 0.1 mm to about 0.5 mm.

A bending protection layer BPL is disposed in at least the bending area BA. The bending protection layer BPL may overlap the bending area BA, the first panel area AA1 and the second panel area AA2. The bending protection layer BPL may be disposed in one portion of the first panel area AA1 and one portion of the second panel area AA2 in addition to the bending area BA.

The bending protection layer BPL may be bendable together with the bending area BA. The bending protection layer BPL protects the bending area BA from an external impact and controls a neutral plane of the bending area BA. The bending protection layer BPL controls a stress of the bending area BA so that the neutral plane becomes closer to signal lines disposed in the bending area BA.

A first surface of the second panel protection layer PPL-2 is attached to the second portion AL4-2 of the fourth adhesive layer AL4 and a second surface of the second panel protection layer PPL-2 is attached to the spacer SPC. Although the single-layered spacer SPC is illustrated in FIGS. 5 and 6, the spacer SPC may have a multi-layered structure in which a baser layer is disposed between two adhesive layers. The base layer may include graphite having a heat dissipation property.

Figure 7:
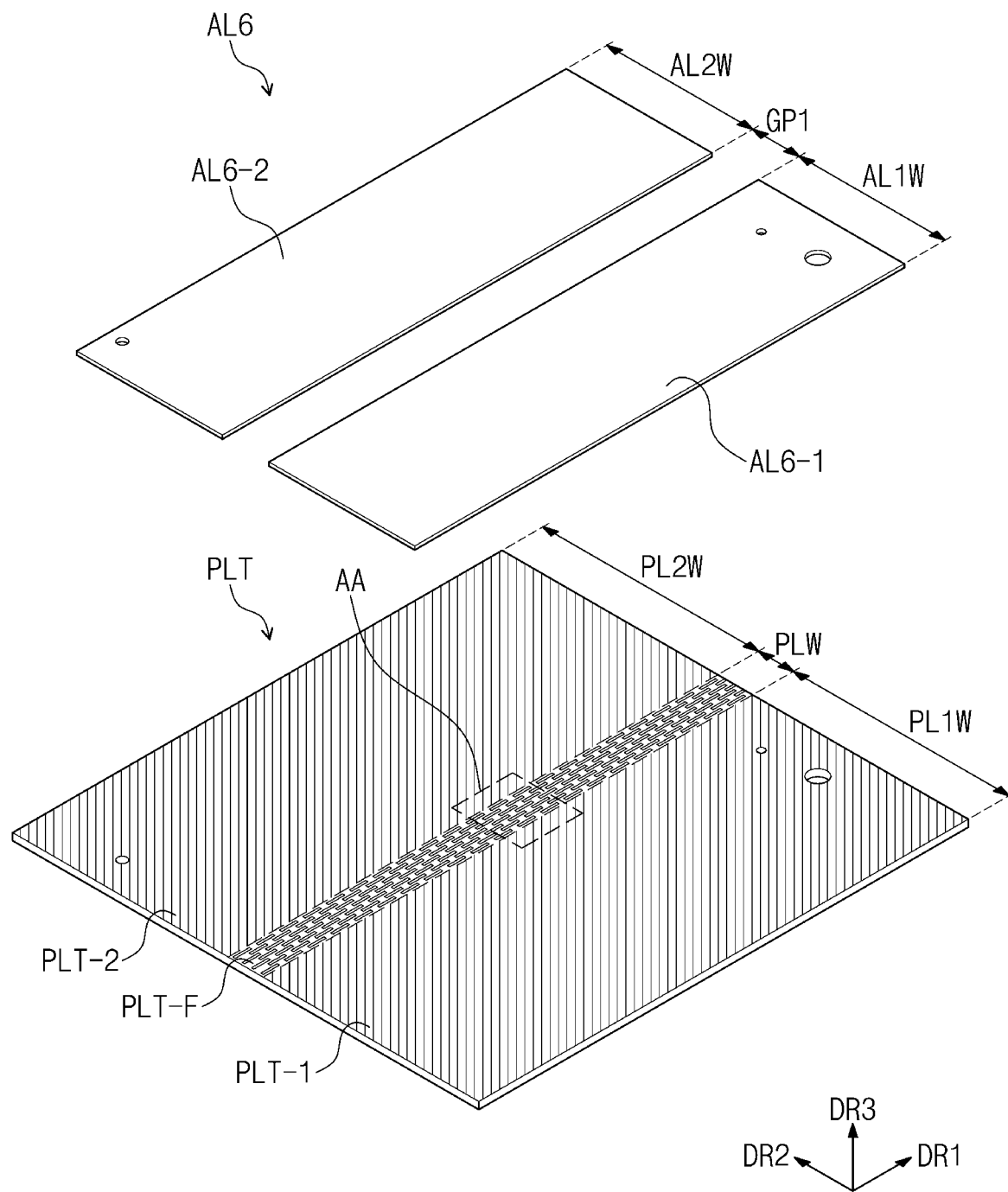
FIG. 7 is an exploded perspective view illustrating an embodiment of a display device.
Figure 8:
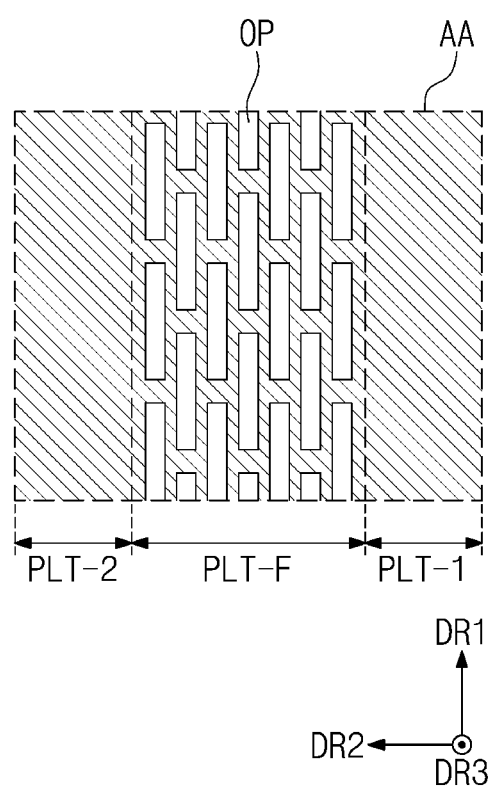
FIG. 8 is an enlarged plane view illustrating an embodiment of area AA of FIG. 7.

FIG. 7 is an exploded perspective view illustrating an embodiment of partial components of the display device DD. FIG. 8 is an enlarged plan view illustrating an embodiment of area AA of FIG. 7. FIG. 7 exemplarily illustrates the barrier adhesive layer AL6 and the support layer PLT.

Referring to FIGS. 7 and 8, the support layer PLT may include a foldable region PLT-F corresponding to the first area FA0 (refer to FIG. 5), a second area PLT-1 corresponding to the second area NFA10 (refer to FIG. 5), and a third area PLT-2 corresponding to the third area NFA20 (refer to FIG. 5). A plurality of openings OP may be defined in the foldable region PLT-F.

The plurality of openings OP may be arranged spaced apart from each other in an arrangement pattern. The plurality of openings OP may be arranged in a lattice form. Each of the plurality of openings OP may completely pass through a thickness of the support layer PLT from a top surface to a rear surface of the support layer PLT. As the plurality of openings OP are defined in the foldable region PLT-F, a planar area of the foldable region PLT-F of the support layer PLT may decrease to reduce strength of the foldable region PLT-F. Thus, the foldable region PLT-F may have greater flexibility than the support layer PLT excluding the plurality of openings OP.

A first distance GP1 between the first barrier portion AL6-1 and the second barrier portion AL6-2 may be greater than a first width PLW of the foldable region PLT-F in which the plurality of openings OP are defined. The first distance GP1 and the first width PLW may be a distance along the second direction DR2. When the first distance GP1 is equal to or less than the first width PLW, at least one of the first barrier portion AL6-1 and the second barrier portion AL6-2 may overlap the plurality of openings OP due to a process error generated during a process of attaching the first barrier portion AL6-1 and the second barrier portion AL6-2 to the support layer PLT. Where at least one of the first barrier portion AL6-1 and the second barrier portion AL6-2 overlaps the plurality of openings OP, the plurality of openings OP may be recognized from outside the display device DD. According to an embodiment, each of the first distance GP1 and the first width PLW may be equal to or greater than a value determined in consideration of the process error. Thus, the first barrier portion AL6-1 and the second barrier portion AL6-2 may not overlap the plurality of openings OP. As a result, the phenomenon in which the plurality of openings OP are recognized from outside may not be generated.

A second width AL1W along the second direction DR2 of the first barrier portion AL6-1 may be less than a third width PL1W along the second direction DR2 of the second area PLT-1, and a fourth width AL2W along the second direction DR2 of the second barrier portion AL6-2 may be less than a fifth width PL2W along the second direction DR2 of the third area PLT-2.

Figure 9:
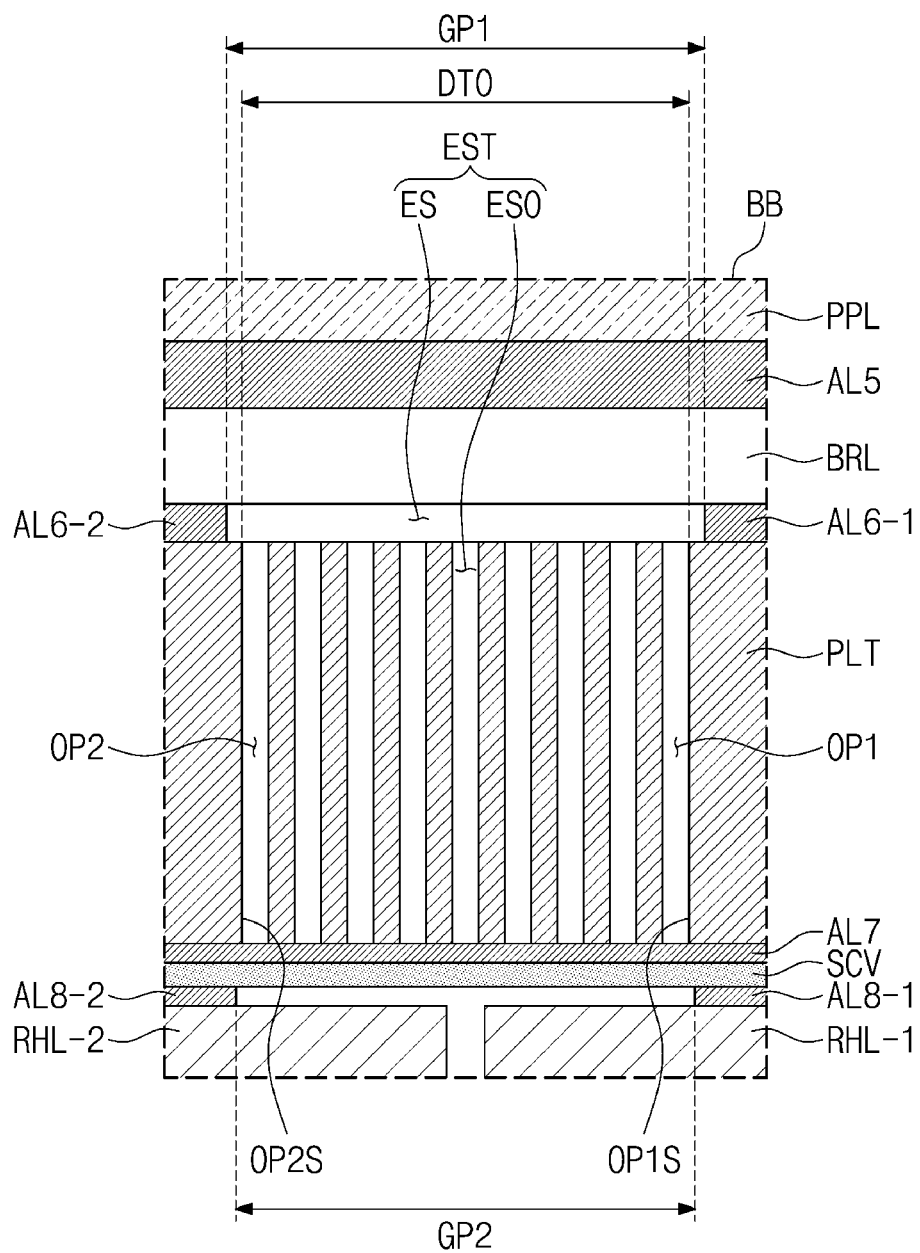
FIG. 9 is an enlarged cross-sectional view illustrating an embodiment of area BB of FIG. 5.

FIG. 9 is an enlarged cross-sectional view illustrating an embodiment of area BB in FIG. 5.

Referring to FIGS. 5 and 9, the plurality of openings OP which correspond to the folding area FA0 of the display panel DP may include a first opening OP1 closest to the non-folding area (e.g., first non-folding area NFA10) and a second opening OP2 furthest from the non-folding area. The support layer PLT includes along the second direction DR2 a first sidewall OP1S which is closest to the non-folding area and defines the first opening OP1, a second sidewall OP2S which is furthest from the non-folding area and defines the second opening OP2, and a second distance DT0 between the first sidewall OP1S and the second sidewall OP2S. That is, at the folding area FA0, the support layer PLT includes a first sidewall OP1S and a second sidewall OP2S spaced apart from each other along the second direction DR2 with the plurality of openings OP therebetween.

Referring to FIGS. 5 and 9, the first distance GP1 between the first barrier portion AL6-1 and the second barrier portion AL6-2 may be greater than a second distance DT0 between a first sidewall OP1S of the support layer PLT at a first opening OP1 that is closest to the second area NFA10 among the plurality of openings OP and a second sidewall OP2S of the support layer PLT at a second opening OP2 that is closest to the third area NFA20 among the plurality of openings OP. In an embodiment, for example, the first distance GP1 may be greater than the second distance DT0 by about 1 mm or more. However, the invention is not limited thereto.

The second distance DT0 between the first sidewall OP1S and the second sidewall OP2S may be equal to or less than the first width PLW of the foldable region PLT-F in FIG. 7.

A third distance GP2 between a first cover portion AL8-1 and a second cover portion AL8-2 may be greater than the first width PLW of the foldable region PLT-F (refer to FIG. 7). Also, the third distance GP2 may be greater than the second distance DT0. In an embodiment, for example, the second distance DT0 may be about 8.65 mm, and each of the first distance GP1 and the third distance GP2 may be about 9.65 mm. A difference between the first distance GP1 and the second distance DT0 may be substantially equal to a difference between the third distance GP2 and the second distance DT0. The expression "substantially equal" may represent a feature of being equal within a process error range.

In an area overlapping the first area FA0, a space EST may be defined between the barrier layer BRL and the first cover adhesive layer AL7. The space EST may be divided into a first space ES and a second space ES0 provided in plural including a plurality of second spaces ES0. The first space ES may be defined by the barrier layer BRL, a top surface of the support layer PLT, the first barrier portion AL6-1 and the second barrier portion AL6-2, and the second spaces ES0 may be defined by the plurality of openings OP, respectively.

Figure 10:
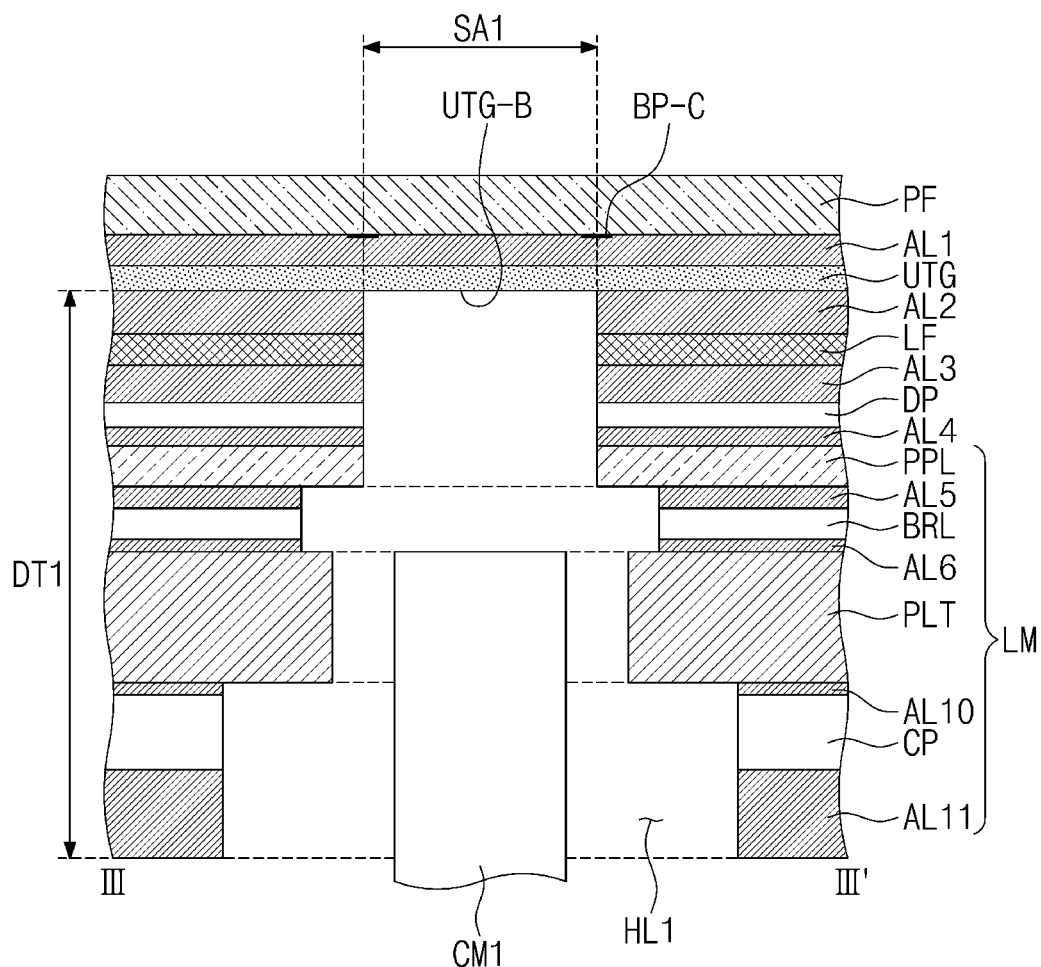
FIG. 10 is a cross-sectional view of an embodiment of the display device of FIG. 1A.
Figure 11:
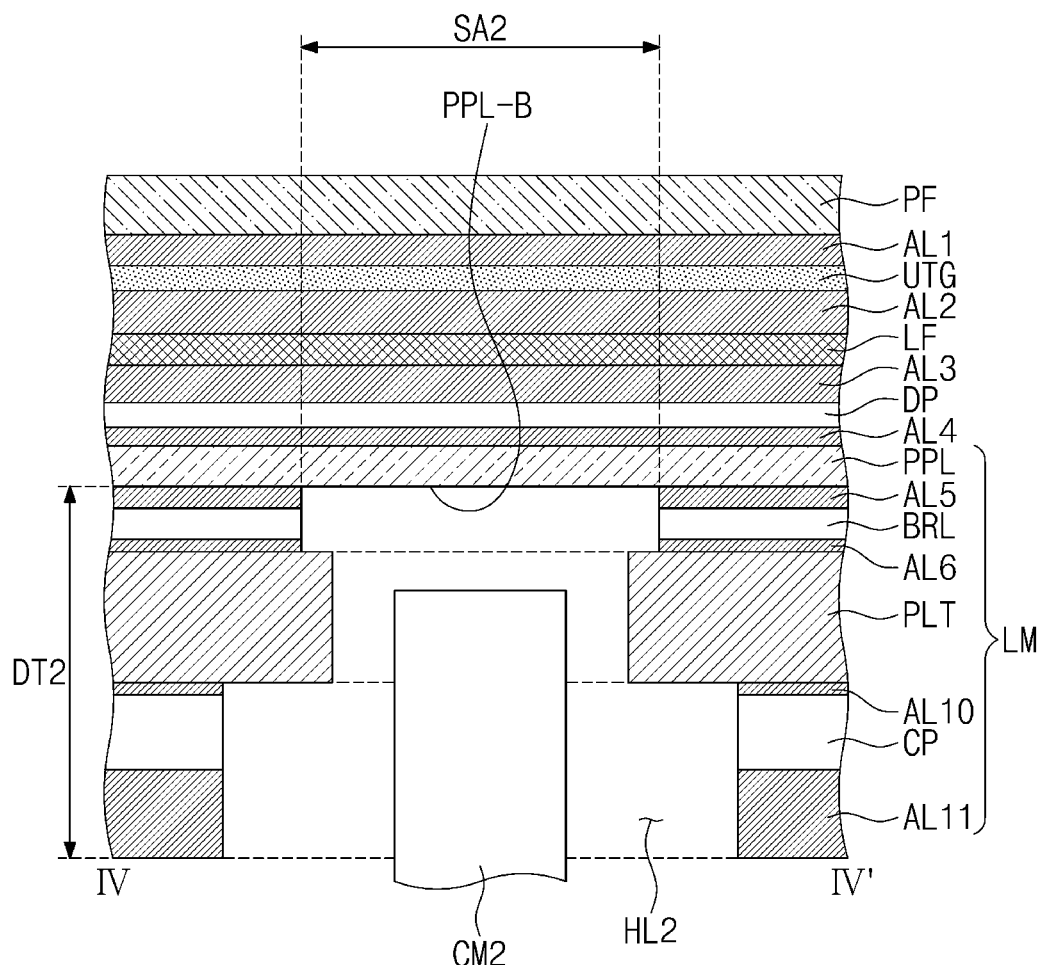
FIG. 11 is a cross-sectional view of an embodiment of the display device of FIG. 1A.

FIG. 10 is a cross-sectional view of an embodiment of the display device DD taken along line of FIG. 1A. FIG. 11 is a cross-sectional view of an embodiment of the display device DD taken along line IV-IV' of FIG. 1A.

Referring to FIG. 10, a first hole HL1 passing from the eleventh adhesive layer AL11 to the second adhesive layer AL2 of the display device DD (refer to FIG. 2) is defined. A bottom surface UTG-B of the thin-film glass substrate UTG may define a bottom of the first hole HL1. The first hole HL1 may be open to outside the electronic device ED and in a direction away from the thin-film glass substrate UTG.

A first electronic module CM1 may overlap or correspond to the first hole HL1 or be insertable into the first hole HL1 from outside the support layer PLT. The first electronic module CM1 may be a camera module. The first electronic module CM1 may acquire an image through the first sensing area SA1. The first hole HL1 may be defined extended through the display panel DP in addition to through the lower member LM. Thus, the first sensing area SA1 may not display an image IM, without being limited thereto. In an embodiment, the first hole HL1 in which the first electronic module CM1 is accommodated may not pass through the display panel DP such that the first sensing area SA1 may display an image IM.

On the plane, a light blocking pattern BP-C overlapping a boundary of the first sensing area SA1 and a portion adjacent to the first sensing area SA1 of the display area DA may be disposed between the plastic film PF and the first adhesive layer AL1. The light blocking pattern BP-C may have a circular ring shape. A shape of the light blocking pattern BP-C may correspond to a shape of the boundary of the first sensing area SA1 and the portion adjacent to the first sensing area SA1 of the display area DA.

Referring to FIG. 11, a second hole HL2 passing from the eleventh adhesive layer AL11 to the fifth adhesive layer AL5 of the display device DD (refer to FIG. 2) is defined. A bottom surface PPL-B of the panel protection layer PPL may define a bottom of the second hole HL2. A second electronic module CM2 may be insertable into the second hole HL2 from outside the support layer PLT. The second electronic module CM2 may be an illumination sensor.

The first hole HL1 corresponds to the first sensing area SA1 and extends through both the display panel DP and the support layer PLT to have a depth. The second hole HL2 corresponds to the second sensing area SA2 and extends through the support layer PLT to have a depth. Referring to FIGS. 10 and 11, a first depth DT1 of the first hole HL1 may be greater than a second depth DT2 of the second hole HL2. The components of the display device DD (refer to FIG. 2) overlapping the first sensing area SA1 may be less in number than the components of the display device DD (refer to FIG. 2) overlapping the second sensing area SA2. Thus, the first sensing area SA1 may have a light transmittance greater than that of the second sensing area SA2. At each of the first hole HL1 and the second hole HL2, the support layer PLT includes sidewalls which face each other along the second direction DR2 to respectively defined the first hole HL1 and the second hole HL2.

Figure 12:
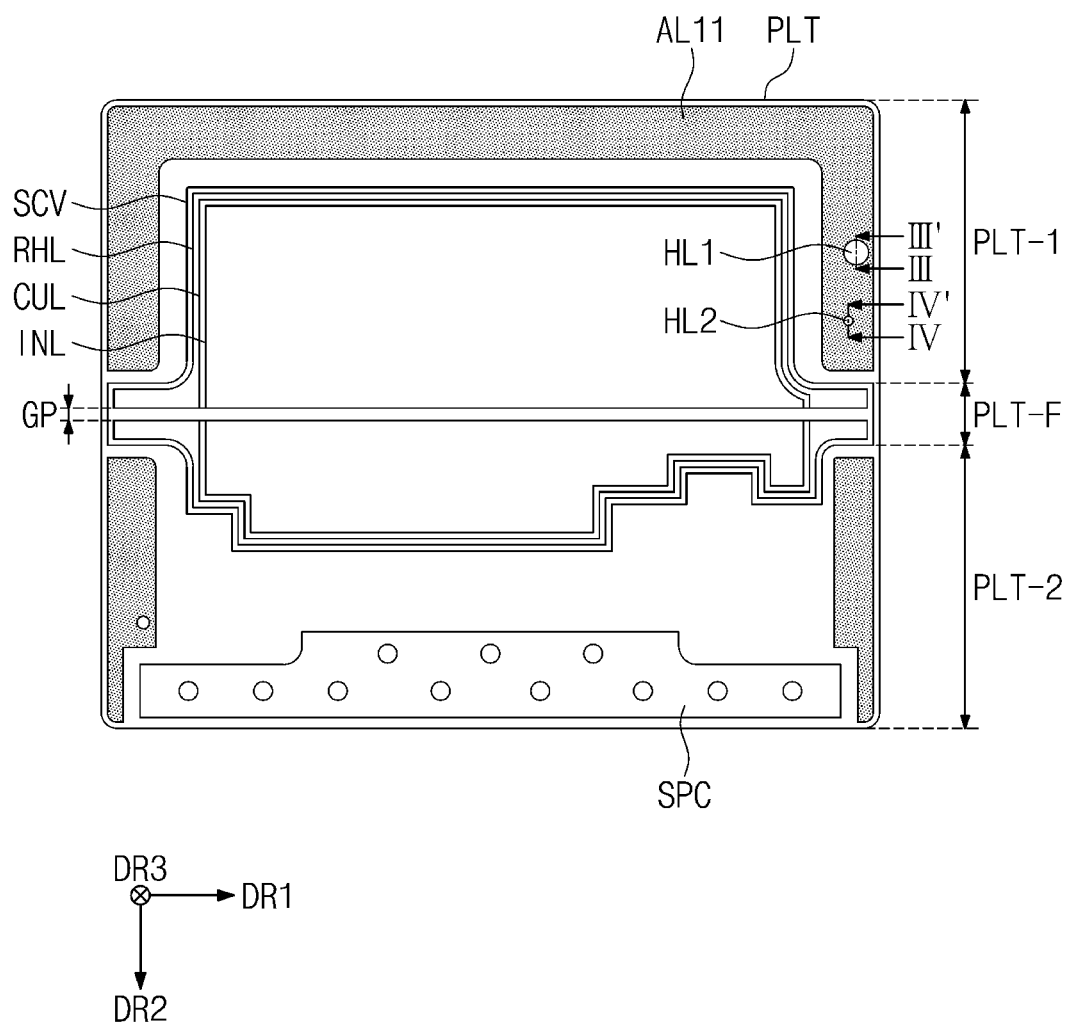
FIG. 12 is a rear view of an embodiment of a display device.

FIG. 12 is a rear view of an embodiment of the display device DD.

FIG. 12 illustrates a rear surface of the support layer PLT. The cover layer SCV, the heat dissipation layer RHL, the cushion layer CUL, and the insulation layer INL are sequentially stacked on the rear surface of the support layer PLT. This stacked structure is disposed on a partial area of the rear surface of the support layer PLT. The cover layer SCV, the heat dissipation layer RHL, the cushion layer CUL, and the insulation layer INL may be spaced apart from the first hole HL1 and the second hole HL2.

The cover layer SCV overlaps the foldable region PLT-F. Although a planar area of components gradually decreases in order from the cover layer SCV, the heat dissipation layer RHL, the cushion layer CUL and the insulation layer INL in FIG. 12, the invention is not limited thereto. The spacer SPC is spaced apart from the stacked structure. The eleventh adhesive layer AL11 may be disposed outside the stacked structure and disposed along an edge of the support layer PLT.

As described above, the barrier layer BRL may be disposed between the display panel DP and the support layer PLT. The first space ES may be defined between the barrier layer BRL and the support layer PLT in which the plurality of openings OP is defined. Thus, the plurality of openings OP may not be recognized from outside of the electronic device ED. Also, as the barrier layer BRL includes a light shielding material, the color difference of the support layer PLT may not be recognized from outside the electronic device ED.

Also, as described above, the cushion layer CUL may be spaced apart from the display panel DP with the support layer PLT therebetween. Thus, when the display panel DP is pressed, the shape deformation of the display panel DP may decrease more than a comparative example in which the cushion layer CUL is disposed between the support layer PLT and the display panel DP. Also, the cushion layer CUL may be disposed below the heat dissipation layer RHL and firmly supported by the heat dissipation layer RHL. Thus, the cushion layer CUL may have the improved impact absorption performance.

Although the embodiments have been described, it is understood that the invention should not be limited to these embodiments but various changes and modifications can be made by one ordinary skilled in the art within the spirit and scope of the invention as hereinafter claimed. Hence, the real protective scope of the invention shall be determined by the technical scope of the accompanying claims.

What is claimed is:

1. A display device comprising:
   a display panel comprising a folding area at which the display panel is foldable and a non-folding area which is adjacent to the folding area along a first direction;
   a barrier layer facing the display panel;
   a support layer facing the display panel with the barrier layer therebetween;
   a plurality of openings which are defined in the support layer and correspond to the folding area of the display panel;
   a cushion layer facing the display panel with the support layer therebetween; and
   a barrier adhesive layer between the barrier layer and the support layer, the barrier adhesive layer comprising a first barrier portion and a second barrier portion spaced apart from each other along the first direction with the plurality of openings of the support layer therebetween.

2. The display device of claim 1, wherein
   the support layer faces both the folding area and the non-folding area, and along the first direction:
   each of the cushion layer, the support layer and the barrier layer has a width,
   the width of the cushion layer is less than the width of the support layer, and
   the width of the barrier layer is less than the width of the support layer.

3. The display device of claim 1, wherein
   the cushion layer comprises a first cushion layer and a second cushion layer spaced apart from each other along the first direction by a gap, and
   the gap by which the first cushion layer and the second cushion layer are spaced apart from each other corresponds to the folding area of the display panel.

4. The display device of claim 1, wherein
   each of the support layer and the cushion layer has an elastic modulus, and
   the elastic modulus of the support layer is greater than the elastic modulus of the cushion layer.

5. The display device of claim 1, wherein
   each of the barrier adhesive layer and the barrier layer has a thickness, and
   the thickness of the barrier adhesive layer is less than the thickness the barrier layer.

6. The display device of claim 1, wherein the barrier layer comprises a colored polyimide film.

7. The display device of claim 1, wherein the barrier layer comprises a light shielding material.

8. The display device of claim 1, wherein along the first direction, the support layer extends further than the barrier layer.

9. The display device of claim 1, wherein
   each of the cushion layer and the barrier layer has a thickness, and
   the thickness of the cushion layer is greater than the thickness of the barrier layer.

10. The display device of claim 1, further comprising an upper adhesive layer between the display panel and the barrier layer,
    wherein
    the upper adhesive layer attaches the display panel to the barrier layer,
    each of the upper adhesive layer and the barrier adhesive layer has a thickness, and
    the thickness of the upper adhesive layer is greater than the thickness of the barrier adhesive layer.

11. The display device of claim 1, wherein
    the first barrier portion and the second barrier portion are spaced apart from each other along the first direction by a first distance,
    along the first direction, the plurality of openings which correspond to the folding area of the display panel comprises a first opening closest to the non-folding area and a second opening furthest from the non-folding area,
    the support layer comprises along the first direction:
        a first sidewall which is closest to the non-folding area and defines the first opening,
        a second sidewall which is furthest from the non-folding area and defines the second opening, and
        a second distance between the first sidewall and the second sidewall, and
    the first distance between the first barrier portion and the second barrier portion is greater than the second distance between the first sidewall and the second sidewall of the support layer.

12. The display device of claim 1, wherein along the first direction:
    the first barrier portion and the second barrier portion are spaced apart from each other by a distance,
    the distance between the first barrier portion and the second barrier portion is greater than a width of an area in which the plurality of openings are defined.

13. The display device of claim 1, wherein the non-folding area of the display panel comprises a display area,
    further comprising:
    a hole which corresponds to the display area and extends through the support layer, and
    along the first direction, the cushion layer spaced apart from the hole which extends through the support layer.

14. An electronic device comprising:
a display panel comprising a foldable area at which the display panel is foldable;
a barrier layer facing the display panel;
a support layer which faces the display panel with the barrier layer therebetween and has a first elastic modulus,
a plurality of openings which are defined the support layer and correspond to the foldable area of the display panel; and
a cushion layer facing the display panel with the support layer therebetween, the cushion layer comprising:
a second elastic modulus lower than the first elastic modulus of the support layer, and
a first cushion layer and a second cushion layer spaced apart from each other at the foldable area of the display panel.

15. The electronic device of claim 14, further comprising a barrier adhesive layer between the barrier layer and the support layer, the barrier adhesive layer comprising:
a first barrier adhesive layer between the barrier layer and the support layer; and
a second barrier adhesive layer between the barrier layer and the display panel,
wherein the first barrier adhesive layer comprises a first barrier portion and a second barrier portion spaced apart from each other with the plurality of openings therebetween.

16. The electronic device of claim 15, wherein
each of the first barrier adhesive layer and the second barrier adhesive layer has a thickness, and
the thickness of the first barrier adhesive layer is less than the thickness of the second barrier adhesive layer.

17. The electronic device of claim 15, wherein
the first barrier portion and the second barrier portion are spaced apart from each other along a first direction by a distance,
at the foldable area, the support layer comprises a first sidewall and a second sidewall spaced apart from each other along the first direction with the plurality of openings therebetween,
the first sidewall and the second sidewall are spaced apart from each other by a width along the first direction, and
the distance between the first barrier portion and the second barrier portion is greater than the width between the first sidewall and the second sidewall of the support layer.

18. The electronic device of claim 14, wherein the display panel further comprises a display area adjacent to the foldable area and a non-display area which is adjacent to both the display area and the foldable area,
further comprising:
a first hole which corresponds to the non-display area and extends through both the display panel and the support layer to have a depth,
a second hole which corresponds to the display area and extends through the support layer to have a depth,
a first electronic module extended into the first hole from outside the support layer; and
a second electronic module extended into the second hole from outside the support layer,
wherein the depth of the first hole is greater than the depth of the second hole.

19. The electronic device of claim 18, wherein
at each of the first hole and the second hole, the support layer comprises sidewalls which face each other along a first direction to respectively defined the first hole and the second hole, and
along the first direction, the cushion layer is spaced apart from each of the first hole and the second hole.

20. The electronic device of claim 14, wherein
each of the cushion layer and the barrier layer has a thickness, and
the thickness of the cushion layer is greater than the thickness of the barrier layer.

21. A display device comprising:
a display panel comprising a folding area at which the display panel is foldable and a non-folding area which is adjacent to the folding area along a first direction;
a barrier layer facing the display panel;
a support layer facing the display panel with the barrier layer therebetween;
a plurality of openings defined in the support layer, the plurality of openings corresponding to the folding area of the display panel and comprising a first opening closest to the non-folding area and a second opening furthest from the non-folding area; and
a barrier adhesive layer between the barrier layer and the support layer, the barrier adhesive layer comprising a first barrier portion and a second barrier portion spaced apart from each other along the first direction at the folding area by a first distance,
wherein
the support layer comprises along the first direction:
a first sidewall which is closest to the non-folding area and defines the first opening,
a second sidewall which is furthest from the non-folding area and defines the second opening, and
a second distance between the first sidewall and the second sidewall, and
the first distance between the first barrier portion and the second barrier portion is greater than the second distance between the first sidewall and the second sidewall of the support layer.

22. The display device of claim 21, further comprising a cushion layer facing the display panel with the support layer therebetween,
wherein
each of the cushion layer and the support layer has an elastic modulus, and
the elastic modulus of the cushion layer is less than the elastic modulus of the support layer.

23. The display device of claim 22, wherein the cushion layer comprises a first cushion layer and a second cushion layer spaced apart from each other along the first direction by a gap, and
the gap by which the first cushion layer and the second cushion layer are spaced apart from each other corresponds to the folding area of the display panel.

24. The display device of claim 23, wherein the non-folding area of the display panel comprises a display area, further comprising:
a hole which corresponds to the display area and extends through the support layer, and
along the first direction, the cushion layer spaced apart from the hole.

* * * * *